US008582349B2

(12) United States Patent
Yamazaki et al.

(10) Patent No.: US 8,582,349 B2
(45) Date of Patent: Nov. 12, 2013

(54) SEMICONDUCTOR DEVICE

(75) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 48 days.

(21) Appl. No.: 13/216,562

(22) Filed: Aug. 24, 2011

(65) Prior Publication Data

US 2012/0051119 A1    Mar. 1, 2012

(30) Foreign Application Priority Data

Aug. 26, 2010  (JP) ................................. 2010-189665

(51) Int. Cl.
*G11C 11/24* (2006.01)

(52) U.S. Cl.
USPC .................. 365/149; 365/230.06; 365/189.05

(58) Field of Classification Search
USPC .............................. 365/149, 230.06, 189.05, 365/189.15–189.17
See application file for complete search history.

(56) References Cited

U.S. PATENT DOCUMENTS

| 4,466,081 | A | 8/1984 | Masuoka |
| 5,731,856 | A | 3/1998 | Kim et al. |
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |

(Continued)

FOREIGN PATENT DOCUMENTS

| EP | 0 053 878 A2 | 6/1982 |
| EP | 1 737 044 A1 | 12/2006 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — David Lam
(74) *Attorney, Agent, or Firm* — Fish & Richardson P.C.

(57) ABSTRACT

An object is to provide a semiconductor device which includes a memory cell capable of holding accurate data even when the data is multilevel data. The semiconductor device includes a memory cell holding data in a node to which one of a source and a drain of a transistor whose channel region is formed from an oxide semiconductor. Note that the value of off-state current (leakage current) of the transistor is extremely small. Thus, after being set to have a predetermined value, the potential of the node can be kept constant or substantially constant by turning the transistor off. In this manner, accurate data can be stored in the memory cell.

20 Claims, 25 Drawing Sheets

(56) References Cited

U.S. PATENT DOCUMENTS

| | | | |
|---|---|---|---|
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,742,324 B2 * | 6/2010 | Juengling | 365/149 |
| 8,054,121 B2 | 11/2011 | Kato | |
| 8,213,253 B2 * | 7/2012 | Fukushi | 365/149 |
| 8,259,518 B2 * | 9/2012 | Peng et al. | 365/149 |
| 8,314,637 B2 | 11/2012 | Kato et al. | |
| 8,320,162 B2 | 11/2012 | Inoue et al. | |
| 8,339,828 B2 | 12/2012 | Yamazaki et al. | |
| 8,339,836 B2 | 12/2012 | Yamazaki et al. | |
| 8,363,452 B2 | 1/2013 | Yamazaki et al. | |
| 8,385,105 B2 | 2/2013 | Saito | |
| 8,395,931 B2 | 3/2013 | Yamazaki et al. | |
| 8,395,938 B2 | 3/2013 | Yamazaki et al. | |
| 8,400,817 B2 | 3/2013 | Yamazaki et al. | |
| 8,410,838 B2 | 4/2013 | Kato et al. | |
| 8,415,731 B2 | 4/2013 | Yamazaki et al. | |
| 8,432,187 B2 | 4/2013 | Kato et al. | |
| 8,450,783 B2 | 5/2013 | Yamazaki et al. | |
| 8,455,868 B2 | 6/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0101351 A1 | 5/2011 | Yamazaki |
| 2011/0122673 A1 | 5/2011 | Kamata et al. |
| 2011/0128777 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156117 A1 | 6/2011 | Yamazaki et al. |
| 2011/0175083 A1 | 7/2011 | Sekine et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176355 A1 | 7/2011 | Furutani et al. |
| 2011/0176377 A1 | 7/2011 | Koyama |
| 2011/0186837 A1 | 8/2011 | Takahashi et al. |
| 2011/0194327 A1 | 8/2011 | Kawae |
| 2011/0194331 A1 | 8/2011 | Kawae et al. |
| 2011/0198593 A1 | 8/2011 | Kato et al. |
| 2011/0199807 A1 | 8/2011 | Saito et al. |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-057783 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 3588553 A | 11/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, No. 12, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, Vol, 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with full English translation).

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply Dram's"; IEEE Transactions on Electron Devices; Jun. 1, 1994; pp. 926-931.

Shoji Shukuri et al.; "A Semi-Static Complementary Gain Cell Technology For Sub-1 V Supply DRAM's"; IEEE Transactions on Electron Devices; Jun. 1, 1994; pp. 926-931; vol. 41, No. 6.

\* cited by examiner 400  450a  437

450b

453

1500

1500

1500

1500

1500

1500

SEMICONDUCTOR DEVICE

BACKGROUND OF THE INVENTION

1. Field of the Invention

The present invention relates to a semiconductor device using a semiconductor element. In particular, the present invention relates to a semiconductor device including a memory device using a semiconductor element. Note that the semiconductor device in this specification indicates all the devices that operate by utilizing semiconductor characteristics.

2. Description of the Related Art

Memory devices using semiconductor elements are broadly classified into two categories: a volatile device that loses stored data when power supply stops, and a non-volatile device that retains stored data even when power is not supplied.

A typical example of a volatile memory device is a DRAM (dynamic random access memory). A DRAM stores data in such a manner that a transistor included in a memory cell is selected and electric charge is stored in a capacitor.

When data is read from a DRAM, electric charge in a capacitor is lost on the above principle; thus, another write operation is necessary every time data is read. Further, a transistor included in a memory cell has leakage current and electric charge flows into or out of a capacitor even when the transistor is not selected, so that the data retention time is short. For that reason, another write operation (refresh operation) is necessary at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is an SRAM (static random access memory). An SRAM retains data by using a circuit such as a flip-flop and thus does not need a refresh operation. This means that an SRAM has an advantage over a DRAM. However, cost per storage capacity is increased because of the use of a flip-flop or the like. Moreover, as in a DRAM, stored data in an SRAM is lost when power supply stops.

A typical example of a non-volatile memory device is a flash memory. A flash memory includes a floating gate between a gate electrode and a channel region in a transistor and stores data by holding electric charge in the floating gate. A flash memory, therefore, has advantages in that the data retention time is extremely long (almost permanent) and a refresh operation which is necessary in a volatile memory device is not needed (e.g., see Patent Document 1).

However, a gate insulating film included in a memory cell deteriorates by tunneling current generated in writing, so that the memory cell stops its function after a predetermined number of write operations. In order to reduce adverse effects of this problem, a method for equalizing the number of write operations for memory cells is employed, for example, in which case a complicated peripheral circuit is needed. Moreover, employing such a method does not solve the fundamental problem of lifetime. In other words, a flash memory is not suitable for applications in which data is frequently rewritten.

In addition, high voltage is necessary for injecting electric charge in the floating gate or removing the electric charge, and a circuit for generating high voltage is also necessary. Further, it takes a relatively long time to inject or remove electric charge, and it is not easy to perform writing and erasing at higher speed.

REFERENCE

Patent Document

[Patent Document 1] Japanese Published Patent Application No. S57-105889

SUMMARY OF THE INVENTION

Such memory devices are actively developed for an increase in its storage capacity (the amount of data that can be stored). An increase in storage capacity causes an increase in circuit size. Such an increase in circuit size, therefore, needs to be prevented by making multilevel data (data of two or more bits) be able to be stored in a memory cell. For example, in the flash memory, multilevel data can be stored by controlling the amount of electric charge held in the floating gate. In other words, data which is stored can be determined by determining the value of the threshold voltage of the transistor, which can be set at a desired value in accordance with the amount of the electric charge.

However, there is limitation on the amount of electric charge which can be held in the floating gate and the amount of electric charge is difficult to minutely control. Moreover, variation in characteristics such as threshold voltage lies even between transistors that are fabricated by the same process. Thus, when multilevel data is stored in a memory cell, probability of failure of retention of accurate data becomes higher.

In view of the above problems, an object of an embodiment of the present invention is to provide a semiconductor device which includes a memory cell capable of holding accurate data even when the data is multilevel data.

An embodiment of the present invention is a semiconductor device which includes a memory cell array including a plurality of memory cells arranged in matrix, a row decoder selecting a given row of the memory cell array in accordance with a row address signal, a column decoder selecting a given column of the memory cell array in accordance with a column address signal, a row address latch holding the row address signal and outputting the row address signal to the row decoder, and a column address latch holding the column address signal and outputting the column address signal to the column decoder. In the semiconductor device, the memory cell holds data in a node to which one of a source and a drain of a transistor whose channel region is formed from an oxide semiconductor is electrically connected. Further, supply of the row address signal to the row address latch and supply of the column address signal to the column address latch are performed through one wiring.

The oxide semiconductor has a band gap wider than that of silicon and an intrinsic carrier density lower than silicon. By using such an oxide semiconductor for a channel formation region of the transistor, the transistor with an extremely low off-state current (leakage current) can be realized.

In addition, the oxide semiconductor is preferably an i-type (intrinsic) or substantially intrinsic oxide semiconductor (purified OS) in which the concentration of impurities such as moisture or hydrogen that might serve as electron donors (donors) has been reduced, because off-state current (leakage current) of the transistor whose channel region is formed from the oxide semiconductor can be further reduced. Specifically, the oxide semiconductor has a hydrogen concentration of $5\times10^{19}$ atoms/cm$^3$ or less, preferably $5\times10^{18}$ atoms/cm$^3$ or less, further preferably $5\times10^{17}$ atoms/cm$^3$ or less when the hydrogen concentration is measured by secondary ion mass spectroscopy (SIMS). The carrier density of the oxide semiconductor measured by Hall effect measurement is less than $1\times10^{14}/cm^3$, preferably less than $1\times10^{12}/cm^3$, further preferably less than $1\times10^{11}/cm^3$. The band gap of the oxide semiconductor is 2 eV or more, preferably 2.5 eV or more, further preferably 3 eV or more.

Here, analysis of the hydrogen concentration by secondary ion mass spectroscopy (SIMS) is mentioned. It is known that it is difficult to accurately obtain data in the proximity of a surface of a sample or in the proximity of an interface between stacked films formed from different materials by the SIMS analysis in principle. Thus, in the case where distributions of the hydrogen concentrations of the film in the thickness direction are analyzed by SIMS, an average value in a region of the film where the value is not greatly changed and almost the same value can be obtained is employed as the hydrogen concentration. Further, in the case where the thickness of the film to be measured is small, a region where almost the same value can be obtained cannot be found in some cases because of the influence of the hydrogen concentration of an adjacent film. In that case, the maximum value or the minimum value of the hydrogen concentration of a region where the film is provided is employed as the hydrogen concentration of the film. Furthermore, in the case where a mountain-shaped peak having the maximum value and a valley-shaped peak having the minimum value do not exist in the region where the film is provided, the value of the inflection point is employed as the hydrogen concentration.

It has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). But such consideration is not appropriate. An alkali metal and an alkaline earth metal are adverse impurities for the oxide semiconductor and are preferably contained as little as possible. An alkali metal, in particular, sodium (Na) diffuses into an oxide and becomes $Na^+$ when an insulating layer in contact with the oxide semiconductor is an oxide. In addition, Na cuts a bond between metal and oxygen or enters the bond in the oxide semiconductor. As a result, transistor characteristics deteriorate (e.g., the transistor becomes normally-on (the shift of threshold voltage to a negative side) or the mobility is decreased). In addition, this also causes variation in the characteristics. Such a problem is significant especially in the case where the hydrogen concentration in the oxide semiconductor is extremely low. Thus, the concentration of an alkali metal is required to be reduced in the case where the concentration of hydrogen in the oxide semiconductor is $5\times10^{19}$ atoms/$cm^3$ or less, particularly $5\times10^{18}$ atoms/$cm^3$ or less. Specifically, in the oxide semiconductor, the least concentration of sodium (Na) needs to be $5\times10^{16}$ atoms/$cm^3$ or less, preferably $1\times10^{16}$ atoms/$cm^3$ or less, further preferably $1\times10^{15}$ atoms/$cm^3$ or less; the least concentration of lithium (Li) needs to be $5\times10^{15}$ atoms/$cm^3$ or less, preferably $1\times10^{15}$ atoms/$cm^3$ or less; and the least concentration of potassium (K) needs to be $5\times10^{15}$ atoms/$cm^3$ or less, preferably $1\times10^{15}$ atoms/$cm^3$ or less, where the above concentrations are measured by secondary ion mass spectroscopy.

Examples of the oxide semiconductor are an In—Sn—Ga—Zn-based oxide semiconductor which is an oxide of four metal elements; an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, and a Sn—Al—Zn-based oxide semiconductor which are oxides of three metal elements; an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, and an In—Ga-based oxide semiconductor which are oxides of two metal elements; and an In-based oxide semiconductor, a Sn-based oxide semiconductor, and a Zn-based oxide semiconductor. Note that in this specification, for example, an In—Sn—Ga—Zn-based oxide semiconductor means metal oxide containing indium (In), tin (Sn), gallium (Ga), and zinc (Zn). There is no particular limitation on the composition ratio. The above oxide semiconductor may contain silicon.

Further, in this specification, an oxide semiconductor can be represented by the chemical formula, $InMO_3(ZnO)_m$ (m>0), for example. Here, M represents one or more metal elements selected from Ga, Al, Mn, and Co.

A semiconductor device according to an embodiment of the present invention includes a memory cell which holds data in a node to which one of a source and a drain of a transistor whose channel region is formed from an oxide semiconductor is electrically connected. Note that the value of off-state current (leakage current) of the transistor is extremely small. Thus, after being set to have a predetermined value, the potential of the node can be kept constant or substantially constant by turning the transistor off. In this manner, accurate data can be stored in the memory cell.

The node is electrically connected to the one of the source and the drain of the transistor. Thus, the potential of the node can be easily controlled by transfer of electric charge through the transistor. In other words, multilevel data can be easily stored in the memory cell.

As compared to the flash memories, in the semiconductor device according to an embodiment of the present invention, data stored in the node is less affected by a specific semiconductor element. In other words, the memory cell can store data without being greatly influenced by variation in the characteristics of semiconductor elements. Thus, potentials can take a plurality of values with short intervals and held in the node as data.

In the semiconductor device according to an embodiment of the present invention, a row address signal and a column address signal are supplied through one wiring. Thus, the number of pins in the semiconductor device can be reduced.

DETAILED DESCRIPTION OF THE INVENTION

An embodiment of the present invention will be described below in detail with reference to the drawings Note that the present invention is not limited to the following description. It will be readily appreciated by those skilled in the art that modes and details of the present invention can be changed in various ways without departing from the spirit and scope of the present invention. Thus, the present invention should not be construed as being limited to the following description of the embodiment.

First, a semiconductor device according to an embodiment of the present invention is described with reference to FIGS. 1A and 1B.

<Structure Example of Semiconductor Device>

Figure 1A:
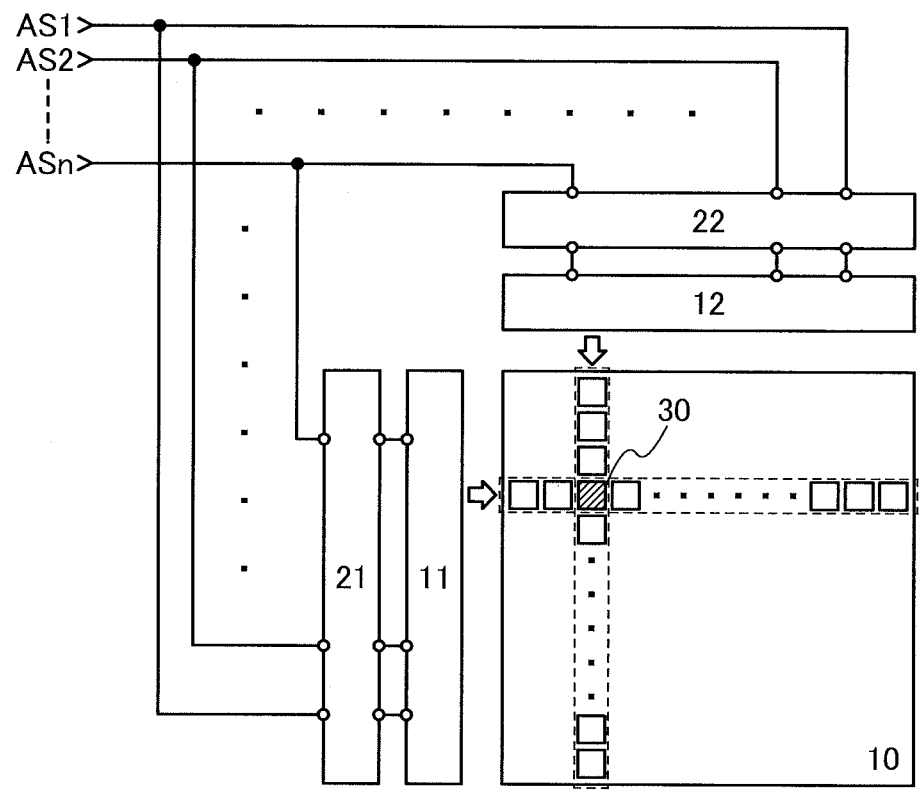
FIGS. 1A and 1B illustrate a structure example of a semiconductor device.

FIG. 1A illustrates a structure example of a semiconductor device according to an embodiment of the present invention. The semiconductor device illustrated in FIG. 1A includes the following components: a memory cell array 10 including a plurality of memory cells 30 arranged in matrix; a row decoder 11 which selects a given row of the memory cell array 10 in accordance with a row address signal; a column decoder 12 which selects a given column of the memory cell array 10 in accordance with a column address signal; a row address latch 21 which holds a row address signal and outputs the row address signal to the row decoder 11; a column address latch 22 which holds a column address signal and outputs the column address signal to the column decoder 12; and wirings (first to n-th address signal lines) for supplying first to n-th address signals (AS1 to ASn; n is a natural number of 3 or more), each of which is electrically connected to the row address latch 21 and the column address latch 22.

Note that in the semiconductor device illustrated in FIG. 1A, a given memory cell 30 (corresponding to the memory cell 30 that is hatched in FIG. 1A) is selected by selection of a row and a column, and data can be written to or read from the memory cell 30.

The first to n-th address signals (AS1 to ASn) represent row address signals in a first period and represent column address signals in a second period that is different from the first period. That is, in the semiconductor device illustrated in FIG. 1A, it is possible to store the row address signals in the row address latch 21 in the first period and to store the column address signals in the column address latch 22 in the second period. Thus, in the semiconductor device illustrated in FIG. 1A, supply of the row address signal and supply of the column address signal can be performed through one wiring. Thus, the number of pins in the semiconductor device can be reduced.

Note that all of the first to n-th address signal lines need to be electrically connected to both the row address latch 21 and the column address latch 22 in the case where the memory cells 30 are arranged in $2^n$ rows by $2^n$ columns in the memory cell array 10; however, in the case where the number of rows and the number of columns are different in the memory cell array 10, such electrical connection is not necessarily employed. That is, in the case where the memory cells 30 are arranged in $2^n$ rows by $2^m$ columns in the memory cell array 10 (m is a natural number less than n), at least m address signal lines among the first to n-th address signal lines may be electrically connected to the column address latch 22. Similarly, in the case where the memory cells 30 are arranged in $2^m$ rows by $2^n$ columns in the memory cell array 10, at least in address signal lines among the first to n-th address signal lines may be electrically connected to the row address latch 21. In short, the wirings (the address signal lines) for supplying address signals (a row address signal and a column address signal) are provided as appropriate so that the given memory cell 30 arranged in the memory cell array 10 can be selected by the decoders (the row decoder 11 and the column decoder 12).

Further, in the semiconductor device illustrated in FIG. 1A, the address signals (the row address signal and the column address signal) are supplied to the two latches (the row address latch 21 and the column address latch 22) through one address signal line; alternatively, the number of the latches may be increased so that the number of the address signal lines can be reduced. For example, a first row address latch, a second row address latch, a first column address latch, and a second column address latch are provided, and address signals are supplied to the four latches through one address signal line so that the number of address signal lines can be reduced by half.

Figure 1B:
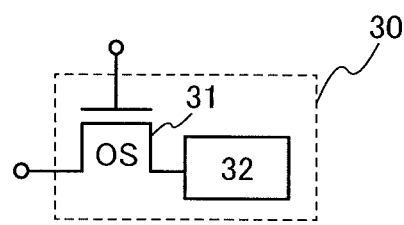

FIG. 1B illustrates a structure example of the memory cell included in the semiconductor device illustrated in FIG. 1A. The memory cell 30 illustrated in FIG. 1B includes a transistor 31 whose channel region is formed from an oxide semiconductor (OS) and a node 32 which is brought into a floating state when the transistor 31 is turned off. Note that the memory cell 30 can hold the value of the potential of the node 32 as data.

The node 32 is electrically connected to one of a source and a drain of the transistor 31. The potential of the node 32 can, therefore, be easily controlled by transfer of electric charge through the transistor 31. In other words, multilevel data can be easily stored in the memory cell 30.

As compared to the flash memories, in the semiconductor device according to an embodiment of the present invention, data stored in the node 32 is less affected by a specific semiconductor element. In other words, the memory cell 30 can store data without being greatly influenced by variation in the characteristics of semiconductor elements. Thus, potentials can take a plurality of values with short intervals and stored in the node 32 as data. For example, the data to be stored in the memory cell 30 can have four lower values by setting potentials held in the node 32 to 0 V, 0.25 V, 0.5 V, and 0.75 V, instead of 0 V, 1 V, 2 V, and 3 V.

<Off-State Current of Transistor Whose Channel Region is Formed from Oxide Semiconductor>

Here, results of measuring the off-state current (leakage current) of a transistor whose channel region is formed from an oxide semiconductor will be described.

First, a method for fabricating a transistor used for the measurement will be described with reference to FIGS. 2A to 2H.

Figure 2A:
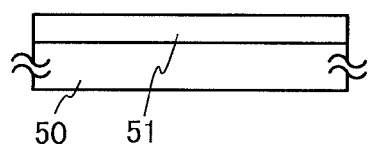
FIGS. 2A to 2H illustrate an example of a method for fabricating a transistor.
Figure 2E:
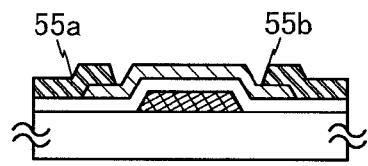
Figure 2B:
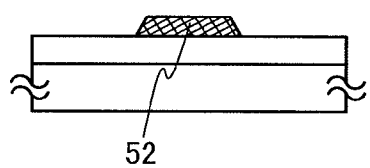
Figure 2F:
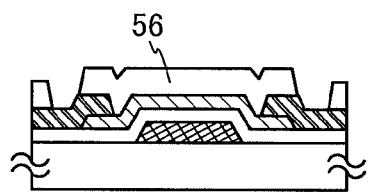

First, a base layer 51 formed of a stack of a 100-nm-thick silicon nitride layer and a 150-nm-thick silicon oxynitride layer was formed by CVD over a glass substrate 50 (see FIG. 2A).

Next, a 100-nm-thick tungsten layer was formed by sputtering over the base layer 51. Then, the tungsten layer was selectively etched by photolithography, so that a gate layer 52 was formed (see FIG. 2B).

Figure 2C:
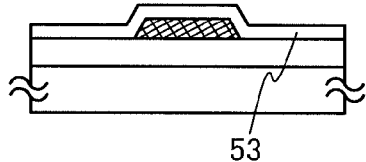

Next, a gate insulating layer 53 formed of a 100-nm-thick silicon oxynitride layer was formed by CVD over the base layer 51 and the gate layer 52 (see FIG. 2C).

Then, a 25-nm-thick oxide semiconductor layer was formed by sputtering over the gate insulating layer 53. A metal oxide target having a composition ratio of $In_2O_3$: $Ga_2O_3$:ZnO=1:1:2 [molar ratio] was used for forming the oxide semiconductor layer. In addition, the oxide semiconductor layer was formed under the following conditions: the substrate temperature was 200° C., the internal pressure of the chamber was 0.6 Pa, the direct-current power was 5 kW, and the atmosphere was a mixed atmosphere of oxygen and argon (the oxygen flow rate was 50 sccm and the argon flow rate was 50 sccm). Then, the oxide semiconductor layer was selectively etched by photolithography, so that an oxide semiconductor layer 54 was formed (see FIG. 2D).

Subsequently, heat treatment was performed at 450° C. for one hour in a mixed atmosphere of nitrogen and oxygen (the percentage of nitrogen was 80% and that of oxygen was 20%).

Then, the gate insulating layer 53 was selectively etched by photolithography (not illustrated). Note that this etching is a step for forming a contact hole for connecting the gate layer 52 and a conductive layer to be formed.

Next, a stack of a 100-nm-thick titanium layer, a 200-nm-thick aluminum layer, and a 100-nm-thick titanium layer was formed by sputtering over the gate insulating layer 53 and the oxide semiconductor layer 54. Then, the stack was selectively etched by photolithography, so that a source layer 55a and a drain layer 55b were formed (see FIG. 2E).

Then, heat treatment was performed at 300° C. for one hour in a nitrogen atmosphere.

Next, a protective insulating layer 56 formed of a 300-nm-thick silicon oxide layer was formed over the gate insulating layer 53, the oxide semiconductor layer 54, the source layer 55a, and the drain layer 55b. Then, the protective insulating layer 56 was selectively etched by photolithography (see FIG. 2F). Note that this etching is a step for forming a contact hole for connecting the gate layer and a conductive layer to be formed, a contact hole for connecting the source layer and a conductive layer to be formed, and a contact hole for connecting the drain layer and a conductive layer to be formed.

Figure 2G:
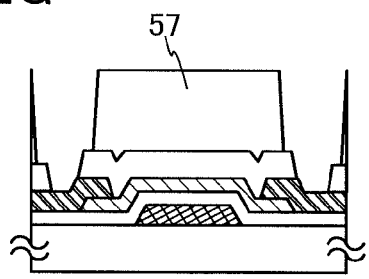
Figure 2D:
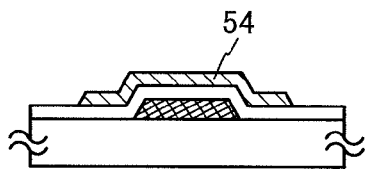
Figure 2H:
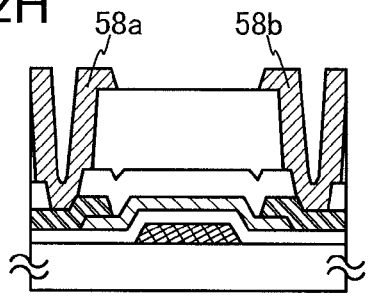

Next, a 1.5-μm-thick acrylic layer was applied over the protective insulating layer 56 and selectively exposed to light, so that a planarization insulating layer 57 was formed (see FIG. 2G). Then, the planarization insulating layer 57 formed of the acrylic layer was baked with heat treatment at 250° C. for one hour in a nitrogen atmosphere.

Subsequently, a 200-nm-thick titanium layer was formed by sputtering over the planarization insulating layer 57. Then, the titanium layer was selectively etched by photolithography, thereby forming the conductive layer (not illustrated) connected to the gate layer 52, a conductive layer 58a connected to the source layer 55a, and a conductive layer 58b connected to the drain layer 55b (see FIG. 2H).

Next, heat treatment was performed at 250° C. for one hour in a nitrogen atmosphere.

Through the above steps, the transistor used for the measurement was fabricated.

Next, a method for calculating the value of off-state current by using a circuit for evaluating characteristics, used in the measurement, will be described below.

Figure 3A:
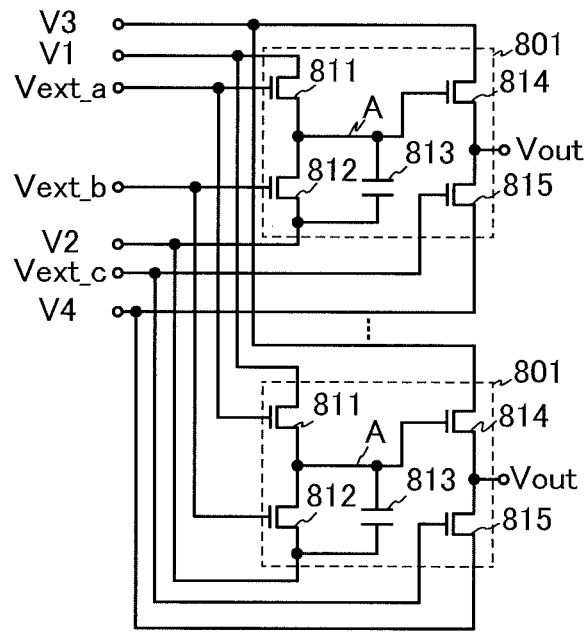
FIGS. 3A to 3C illustrate a method for measuring off-state current of a transistor.
Figure 3B:
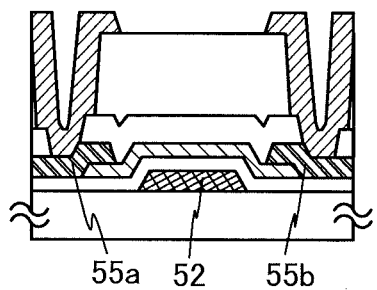
Figure 3C:
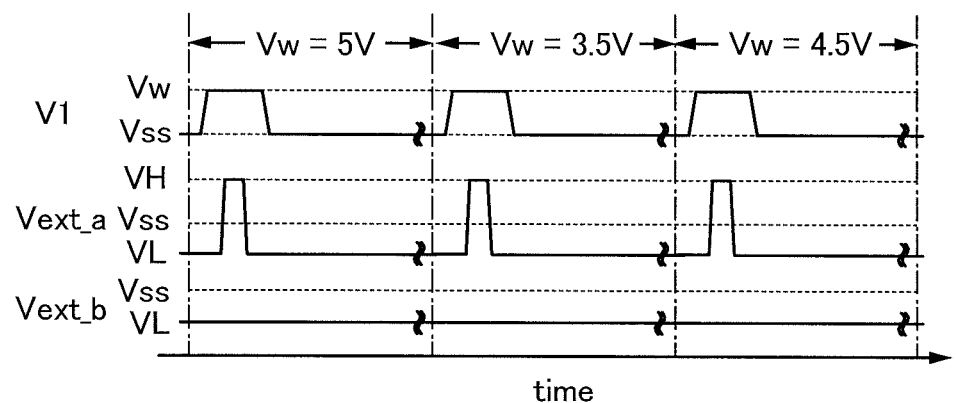

Current measurement using a circuit for evaluating characteristics will be described with reference to FIGS. 3A to 3C. FIGS. 3A to 3C are diagrams for explaining a circuit for evaluating characteristics.

First, a configuration of a circuit for evaluating characteristics is described with reference to FIG. 3A. FIG. 3A is a circuit diagram illustrating the configuration of the circuit for evaluating characteristics.

The circuit for evaluating characteristics illustrated in FIG. 3A includes a plurality of measurement systems 801. The plurality of measurement systems 801 are connected in parallel with each other. Here, eight measurement systems 801 are connected in parallel with each other. By using the plurality of measurement systems 801, a plurality of leakage currents can be measured at the same time.

The measurement system 801 includes a transistor 811, a transistor 812, a capacitor 813, a transistor 814, and a transistor 815.

The transistors 811, 812, 814, and 815 are n-channel field effect transistors.

A voltage V1 is input to one of a source and a drain of the transistor 811. A voltage Vext_a is input to a gate of the transistor 811. The transistor 811 is a transistor for injecting charge.

One of a source and a drain of the transistor 812 is connected to the other of the source and the drain of the transistor 811. A voltage V2 is input to the other of the source and the drain of the transistor 812. A voltage Vext_b is input to a gate of the transistor 812. The transistor 812 is a transistor for evaluating leakage current. Note that "leakage current" here refers to leakage current including off-state current of the transistor 812.

One electrode of the capacitor 813 is connected to the other of the source and the drain of the transistor 811. The voltage V2 is input to the other electrode of the capacitor 813. Here, the voltage V2 is 0 V.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the one electrode of the capacitor 813 are connected to each other is referred to as a node A. Here, the voltage V3 is 5 V.

One of a source and a drain of the transistor 815 is connected to the other of the source and the drain of the transistor 814. A voltage V4 is input to the other of the source and the drain of the transistor 815. A voltage Vext_c is input to a gate of the transistor 815. Here, the voltage Vext_c is 0.5 V.

The measurement system 801 outputs a voltage at a portion where the other of the source and the drain of the transistor 814 is connected to the one of the source and the drain of the transistor 815, as an output voltage Vout.

Here, as the transistor 811, a transistor that is fabricated by the fabrication method described with reference to FIGS. 2A to 2H and has a channel length L of 10 μm and a channel width W of 10 μm is used.

As the transistors 814 and 815, a transistor that is fabricated by the fabrication method described with reference to FIGS. 2A to 2H and has a channel length L of 3 μm and a channel width W of 100 μm is used.

At least the transistor 812 includes a 1-μm-wide offset region in which the gate layer 52 does not overlap with the source layer 55a and the drain layer 55b as illustrated in FIG. 3B. By providing the offset region, parasitic capacitance can be reduced.

Further, as the transistor 812, six samples (SMP) of transistors having different channel lengths L and channel widths W are used (see Table 1).

TABLE 1

|  | L[μm] | W[μm] |
|---|---|---|
| SMP1 | 1.5 | $1 \times 10^5$ |
| SMP2 | 3 | $1 \times 10^5$ |
| SMP3 | 10 | $1 \times 10^5$ |
| SMP4 | 1.5 | $1 \times 10^6$ |
| SMP5 | 3 | $1 \times 10^6$ |
| SMP6 | 10 | $1 \times 10^6$ |

The transistor for injecting charge and the transistor for evaluating leakage current are separately provided as illustrated in FIG. 3A, so that the transistor for evaluating leakage current can be always kept off while electric charge is injected.

In addition, the transistor for injecting charge and the transistor for evaluating leakage current are separately provided, whereby each transistor can have an appropriate size. When the channel width W of the transistor for evaluating leakage current is made larger than that of the transistor for injecting charge, leakage current components of the circuit for evaluating characteristics other than the leakage current of the transistor for evaluating leakage current can be made relatively small. As a result, the leakage current of the transistor for evaluating leakage current can be measured with high accuracy. In addition, since the transistor for evaluating leakage current does not need to be turned on at the time of charge injection, the measurement is not adversely affected by variation in the voltage of the node A, which is caused when part of electric charge in the channel region of the transistor for evaluating leakage current flows into the node A.

Next, a method for measuring leakage current of the circuit for evaluating characteristics illustrated in FIG. 3A will be described with reference to FIG. 3C. FIG. 3C is a timing chart for explaining the method for measuring leakage current with use of the circuit for evaluating characteristics illustrated in FIG. 3A.

In the method for measuring the leakage current with the circuit for evaluating characteristics illustrated in FIG. 3A, a write period and a hold period are provided. The operation in each period is described below.

In the write period, a voltage VL (−3 V) with which the transistor 812 is turned off is input as the voltage Vext_b. Further, a write voltage Vw is input as the voltage V1, and then, a voltage VH (5 V) with which the transistor 811 is turned on is input as the voltage Vext_a for a given period.

Thus, electric charge is accumulated in the node A, and the voltage of the node A becomes equivalent to the write voltage Vw. Then, the voltage VL with which the transistor 811 is turned off is input as the voltage Vext_a. After that, a voltage VSS (0 V) is input as the voltage V1.

In the hold period, the amount of change in the voltage of the node A, caused by change in the amount of the electric charge held in the node A, is measured. From the amount of change in the voltage, the value of the current flowing between the source and the drain of the transistor 812 can be calculated. In the above manner, electric charge can be accumulated in the node A, and the amount of change in the voltage of the node A can be measured.

Accumulation of electric charge in the node A and measurement of the amount of change in the voltage of the node A (also referred to as an accumulation and measurement operation) are repeatedly performed. First, a first accumulation and measurement operation is repeated 15 times. In the first accumulation and measurement operation, a voltage of 5 V is input as the write voltage Vw in the write period and retained for 1 hour in the hold period. Next, a second accumulation and measurement operation is repeated twice. In the second accumulation and measurement operation, a voltage of 3.5 V is input as the write voltage Vw in the write period and retained for 50 hours in the hold period. Next, a third accumulation and measurement operation is performed once. In the third accumulation and measurement operation, a voltage of 4.5 V is input as the write voltage Vw in the write period and retained for 10 hours in the hold period. By repeating the accumulation and measurement operation, the measured current value can be confirmed to be the value in the steady state. In other words, the transient current (a current component that decreases over time after the measurement starts) can be removed from current $I_A$ flowing through the node A. Consequently, the leakage current can be measured with higher accuracy.

In general, a voltage $V_A$ of the node A is expressed as a function of the output voltage Vout by Formula 1.

[Formula 1]

$$V_A = F(Vout) \quad (1)$$

Electric charge $Q_A$ of the node A is expressed by Formula 2, using the voltage $V_A$ of the node A, capacitance $C_A$ connected to the node A, and a constant (const). Here, the capacitance $C_A$ connected to the node A is the sum of the capacitance of the capacitor 813 and a capacitance other than that of the capacitor 813.

[Formula 2]

$$Q_A = C_A V_A + \text{const} \quad (2)$$

Since the current $I_A$ of the node A is the time differential of electric charge flowing into the node A (or electric charge flowing from the node A), the current $I_A$ of the node A is expressed by Formula 3.

[Formula 3]

$$I_A = \frac{\Delta Q_A}{\Delta t} = \frac{C_A \cdot \Delta F(Vout)}{\Delta t} \quad (3)$$

Here, Δt is about 54000 sec. As above, the current $I_A$ of the node A, which is the leakage current, can be calculated with the capacitance $C_A$ connected to the node A and the output voltage Vout, so that the leakage current of the circuit for evaluating characteristics can be obtained.

Next, the results of measuring the output voltage by the measurement method using the above circuit for evaluating characteristics and the value of the leakage current of the circuit for evaluating characteristics, which is calculated from the measurement results, will be described with reference to FIGS. 4A and 4B.

Figure 4A:
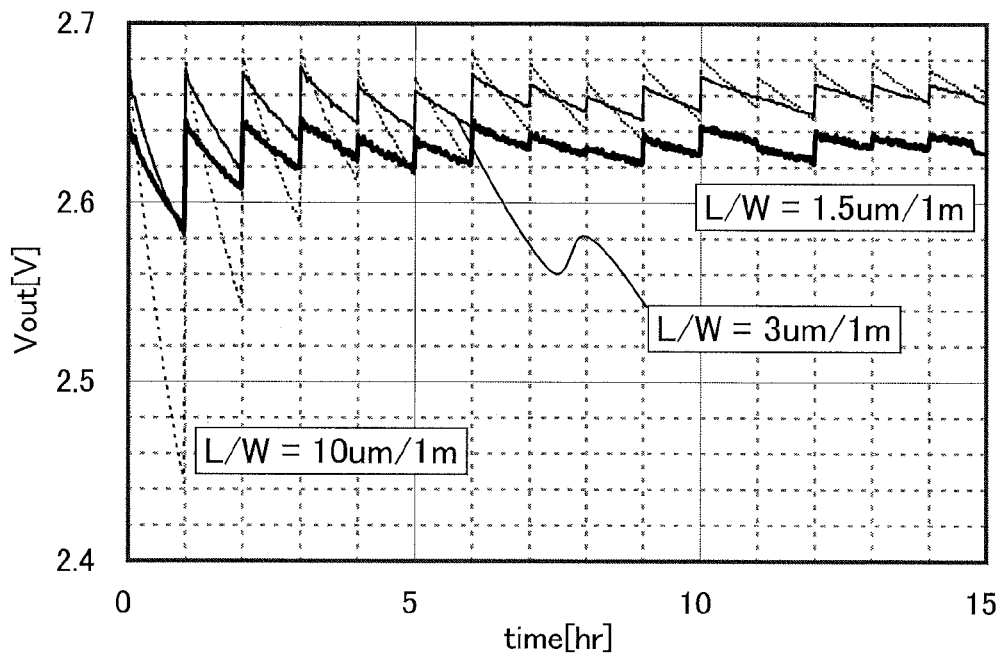
FIGS. 4A and 4B show characteristics of a transistor.
Figure 4B:
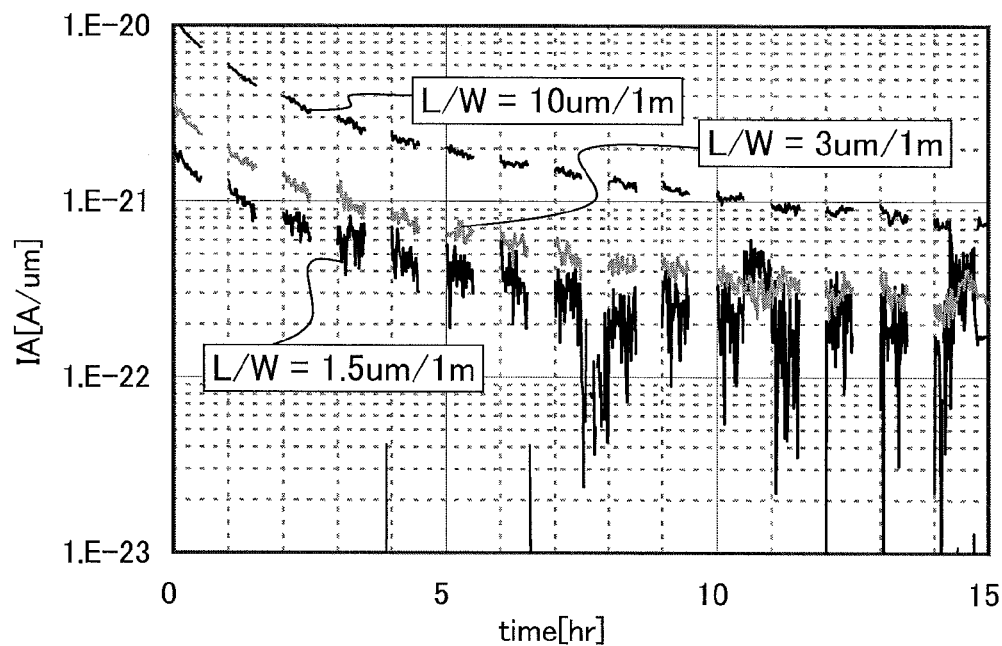

As an example, FIG. 4A shows the relation between the elapsed time Time of the above measurement (the first accumulation and measurement operation) of the transistors SMP1, SMP2, and SMP3 and the output voltage Vout. FIG. 4B shows the relation between the elapsed time Time of the above measurement and the current $I_A$ calculated by the measurement. It is found that the output voltage Vout varies after the measurement starts and it takes 10 hours or longer to reach a steady state.

Figure 5:
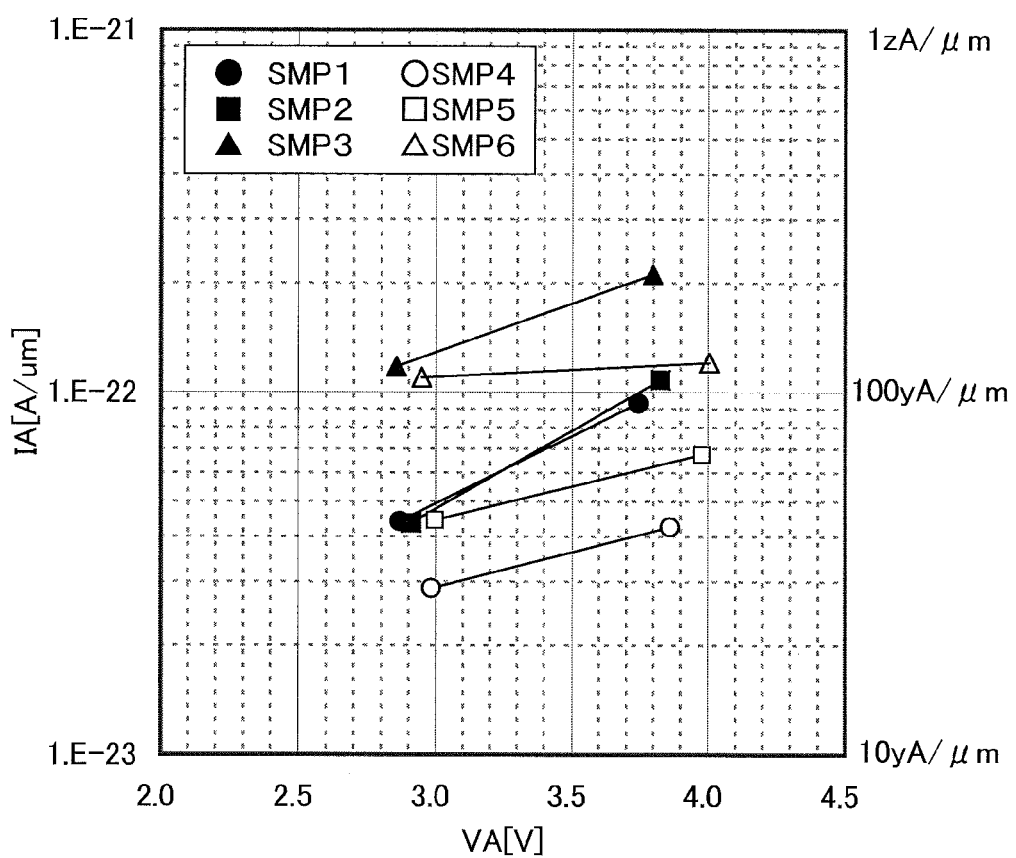
FIG. 5 shows characteristics of a transistor.

FIG. 5 shows the relation between the voltage of the node A in SMP1 to SMP6 and the leakage current estimated by the above measurement. In SMP4 in FIG. 5, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 6:
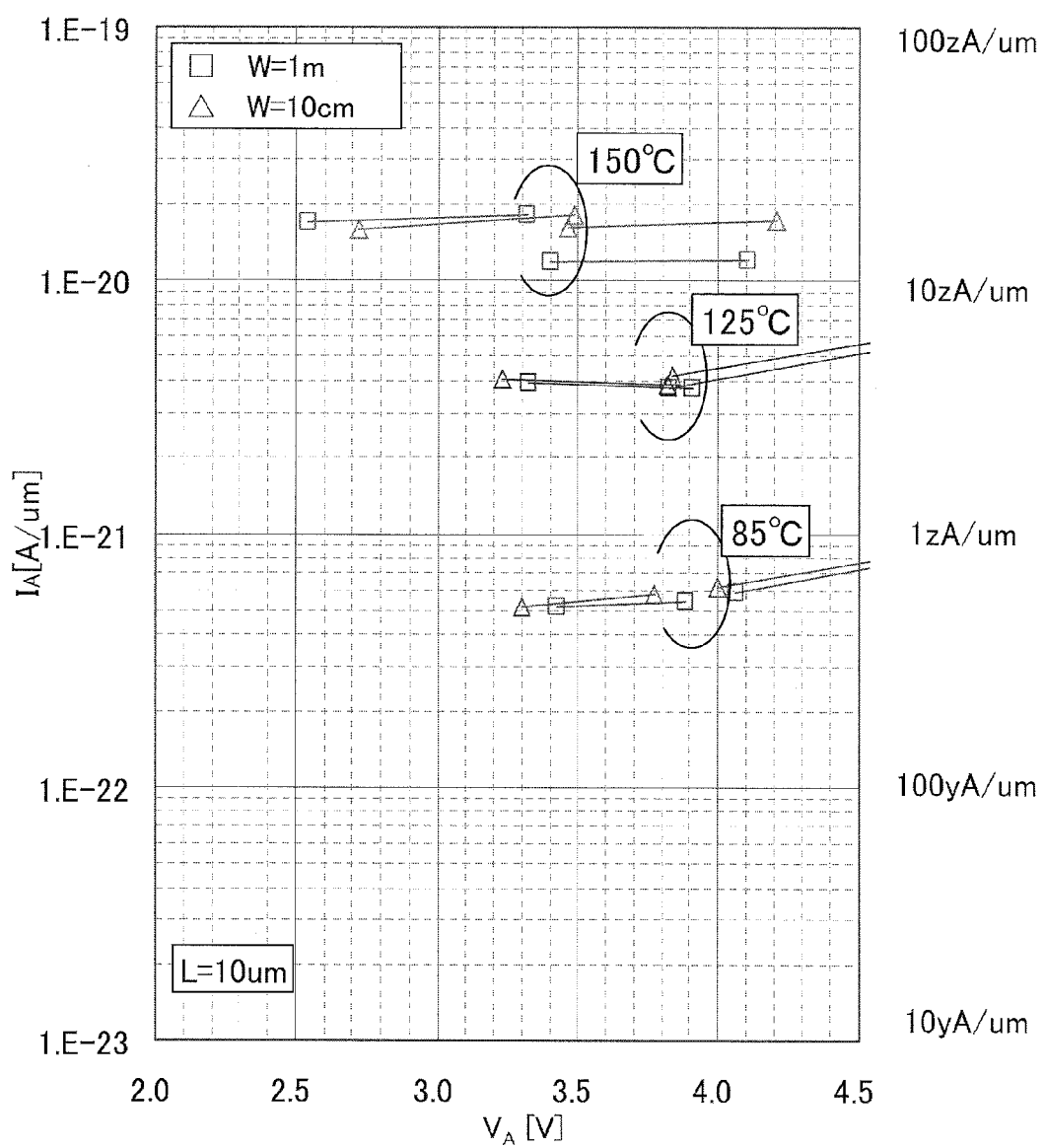
FIG. 6 shows characteristics of a transistor.
Figure 7:
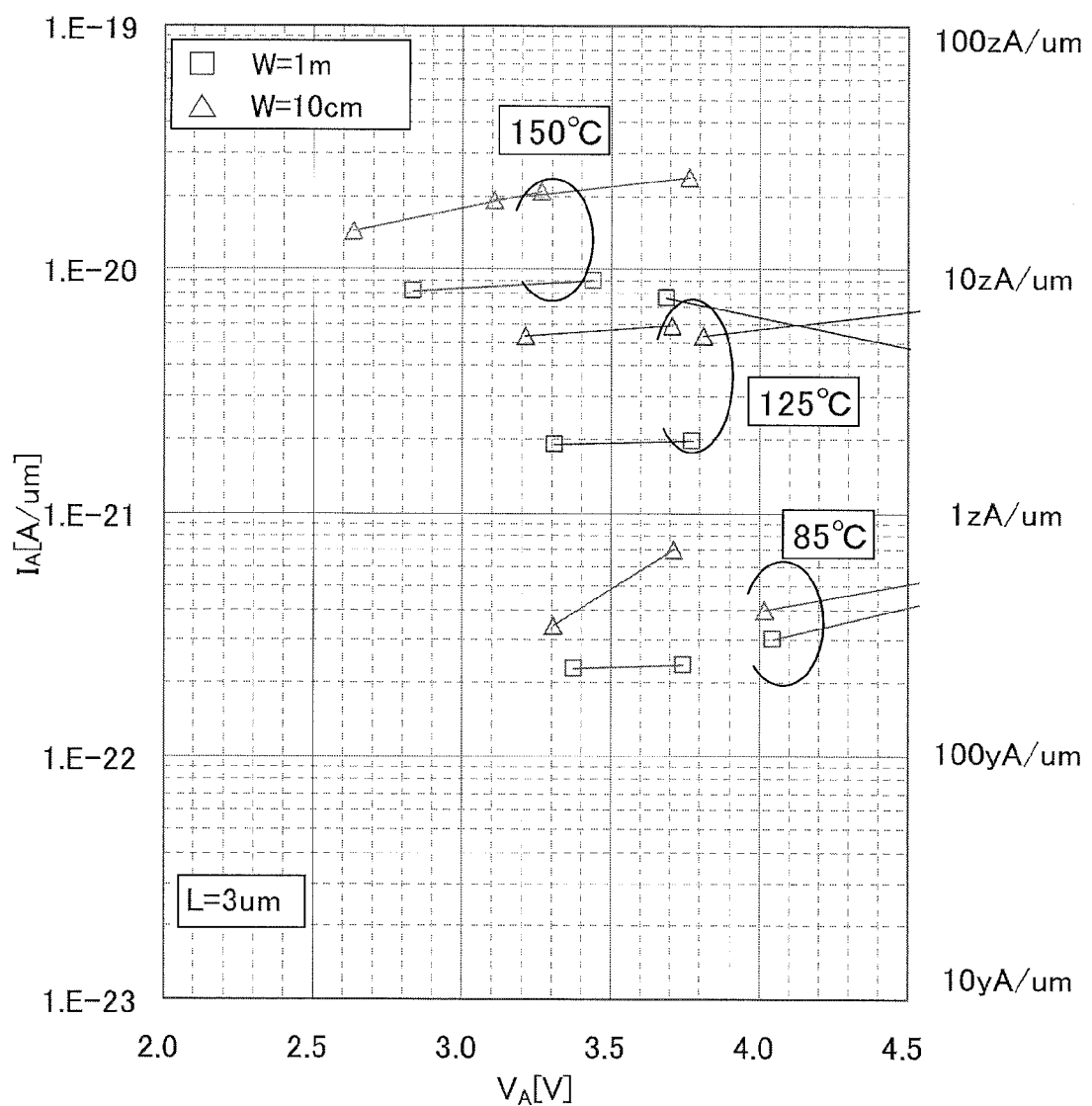
FIG. 7 shows characteristics of a transistor.
Figure 8:
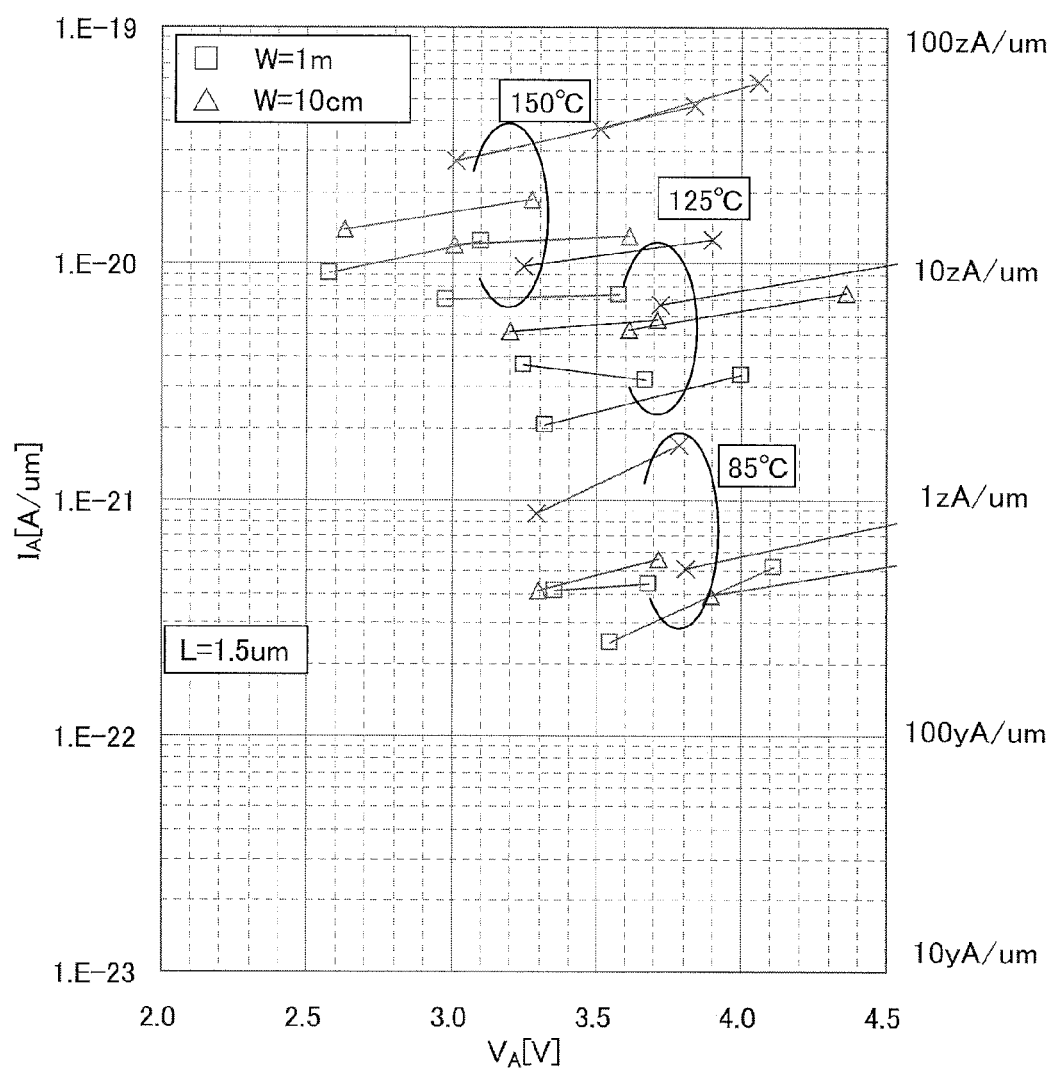
FIG. 8 shows characteristics of a transistor.

FIG. 6, FIG. 7, and FIG. 8 each show the relation between the voltage of the node A in SMP1 to SMP6 at 85° C., 125° C., and 150° C. and the leakage current estimated by the above measurement. As shown in FIG. 6, FIG. 7, and FIG. 8, the leakage current is 100 zA/μm or less even at 150° C.

As described above, the leakage current is sufficiently low in the circuit for evaluating characteristics, including the transistor whose channel region is formed from an oxide semiconductor, which means that the off-state current of the transistor is sufficiently low. In addition, the off-state current of the transistor is sufficiently low even when the temperature rises.

<Semiconductor Device Disclosed in this Specification>

A semiconductor device disclosed in this specification includes a memory cell which holds data in a node to which one of a source and a drain of a transistor whose channel region is formed from an oxide semiconductor is electrically connected. Note that off-state current (leakage current) of the transistor is extremely low. Thus, after being set to have a predetermined value, the potential of the node can be kept constant or substantially constant by turning the transistor off. In this manner, accurate data can be stored in the memory cell.

The node is electrically connected to the one of the source and the drain of the transistor. The potential of the node can, therefore, be easily controlled by transfer of electric charge through the transistor. In other words, multilevel data can be easily stored in the memory cell.

As compared to the flash memories, in the semiconductor device according to an embodiment of the present invention, data stored in the node is less affected by a specific semiconductor element. In other words, the memory cell can hold data without being greatly influenced by variation in the characteristics of semiconductor elements. Thus, potentials can take a plurality of values with short intervals and held in the node as data.

In the semiconductor device disclosed in this specification, a row address signal and a column address signal are supplied through one wiring. Thus, the number of pins in the semiconductor device can be reduced.

<Specific Example>

Specific examples of the above-described semiconductor device are described with reference to FIGS. 9A and 9B, FIGS. 10A to 10F, FIGS. 11A and 11B, FIG. 12, FIGS. 13A to 13H, FIGS. 14A to 14G, FIGS. 15A to 15D, FIG. 16, FIGS. 17A and 17B, FIGS. 18A and 18B, FIGS. 19A and 19B, FIG. 20, FIG. 21, and FIGS. 22A to 22C.

<Specific Example 1 of Memory Cell 30>

Figure 9A:
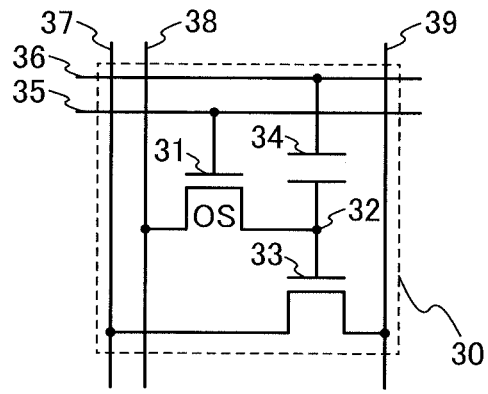
FIGS. 9A and 9B are circuit diagrams illustrating specific examples of a memory cell.

FIG. 9A is a circuit diagram illustrating a specific example of the memory cell 30. The memory cell 30 illustrated in FIG. 9A includes the transistor 31, a transistor 33, and a capacitor 34. A gate of the transistor 31 is electrically connected to a writing word line 35, and one of the source and the drain of the transistor 31 is electrically connected to a writing bit line 38. A gate of the transistor 33 is electrically connected to the other of the source and the drain of the transistor 31, one of a source and a drain of the transistor 33 is electrically connected to a reading bit line 37, and the other of the source and the drain of the transistor 33 is electrically connected to a fixed potential line 39. One electrode of the capacitor 34 is electrically connected to the other of the source and the drain of the transistor 31 and the gate of the transistor 33, and the other electrode of the capacitor 34 is electrically connected to a reading word line 36. Note that the node 32 is a node to which the other of the source and the drain of the transistor 31, the gate of the transistor 33, and the one electrode of the capacitor 34 are electrically connected. As a potential supplied to the fixed potential line 39, a ground potential (GND), 0 V, or the like can be employed. Further, the transistor 31 is a transistor whose channel region is formed from an oxide semiconductor (OS); on the other hand, a semiconductor material from which a channel region of the transistor 33 is formed is not particularly limited.

The memory cell 30 illustrated in FIG. 9A can control switching of the transistor 33 in accordance with the potential of the node 32. In addition, the potential of the node 32 can be controlled by capacitive coupling with the reading word line 36. Thus, in the memory cell 30 illustrated in FIG. 9A, multilevel data can be stored. That is, a state (an on state or an off state) of the transistor 33 is determined under a plurality of conditions where potentials of the reading word line 36 are different from each other, whereby reading can be performed even when the potential of the node 32 is a multivalued potential. Note that the reading can be performed by, for example, determining an output signal of a voltage divider circuit including the transistor 33. In addition, the memory cell 30 illustrated in FIG. 9A can be used as a memory cell which retains binary data.

<Specific Example 2 of Memory Cell 30>

Figure 9B:
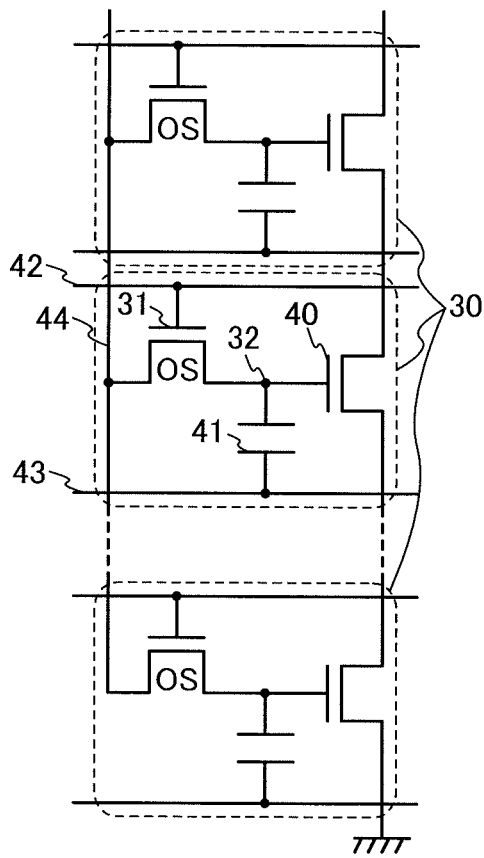

FIG. 9B is a circuit diagram illustrating a specific example of the memory cell 30, which is different from that in FIG. 9A. Each of the memory cells 30 in FIG. 9B is one of the memory cells 30 arranged in a line. The memory cell 30 includes the transistor 31, a transistor 40, and a capacitor 41. The gate of the transistor 31 is electrically connected to a writing word line 42, and one of the source and the drain of the transistor 31 is electrically connected to a bit line 44. A gate of the transistor 40 is electrically connected to the other of the source and the drain of the transistor 31. One electrode of the capacitor 41 is electrically connected to the other of the source and the drain of the transistor 31 and the gate of the transistor 40, and the other electrode of the capacitor 41 is electrically connected to a reading word line 43. In addition, one of the source and the drain of the transistor 40 included in the k-th (k is a natural number greater than or equal to 2 and less than n) memory cell 30 is electrically connected to the other of the source and the drain of the transistor 40 included in the (k−1)-th memory cell 30, and the other of the source and the drain of the transistor 40 included in the k-th memory cell 30 is electrically connected to the one of the source and the drain of the transistor 40 included in the (k+1)-th memory cell 30. Note that the one of the source and the drain of the transistor 40 included in the first memory cell 30 functions as an output terminal. In addition, the other of the source and the drain of the transistor 40 included in the n-th memory cell 30 is grounded. Note that the node 32 is a node to which the other of the source and the drain of the transistor 31, the gate of the transistor 40, and the one electrode of the capacitor 41 are electrically connected. Further, the transistor 31 included in the memory cell 30 is a transistor whose channel region is formed from an oxide semiconductor (OS); on the other hand, a semiconductor material from which a channel region of the transistor 40 included in the memory cell 30 is formed is not particularly limited.

The memory cell 30 illustrated in FIG. 9B can control switching of the transistor 40 in accordance with the potential of the node 32. In addition, the potential of the node 32 can be controlled by capacitive coupling with the reading word line 43. Note that in a semiconductor device which includes the memory cells 30 illustrated in FIG. 9B, when data retained in any one of the n memory cells 30 arranged in a line is read, potentials of the reading word lines 43 of the (n−1) memory cells 30 except the memory cell 30 are increased to a high-level potential. Thus, the transistors 40 included in the (n−1) memory cells 30 except the memory cell 30 are turned on. Thus, the one of the source and the drain of the transistor 40 included in the memory cell 30 is electrically connected to the output terminal, and the other of the source and the drain of the transistor 40 in the memory cell 30 is grounded. Here, a state (an on state or an off state) of the transistor 40 included in the memory cell 30 is determined, whereby data can be obtained. Specifically, a voltage divider circuit is formed using the transistor 40 included in the memory cell 30, and for example, an output signal of the voltage divider circuit is determined, whereby data can be obtained. Note that in the case where multilevel data is determined by the memory cell 30 illustrated in FIG. 9B, the state (an on state or an off state) of the transistor 40 needs to be determined under a plurality of conditions where potentials of the reading word line 43 are different from each other. In addition, the memory cell 30 illustrated in FIG. 9B can be used as a memory cell which retains binary data.

<Specific Example 1 of Row Address Latch 21 and Column Address Latch 22>

Figure 10A:
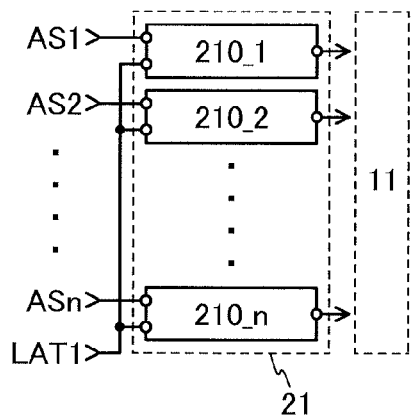
FIGS. 10A, 10B, 10C, 10D, 10E, and 10F illustrate a specific example of a row address latch, a specific example of a column address latch, specific examples of a row address signal latch and a column address signal latch, a specific example of a switch, a specific example of an inverter, and a specific operation example of a row address latch and a column address latch, respectively.

FIG. 10A illustrates a specific example of the row address latch 21. The row address latch 21 illustrated in FIG. 10A includes first to n-th row address signal latches 210_1 to 210_n. A first input terminal of the first row address signal latch 210_1 is electrically connected to the first address signal line; a second input terminal of the first row address signal latch 210_1 is electrically connected to a wiring (also referred to as a first latch signal line) supplying a first latch signal (LAT1); and an output terminal of the first row address signal latch 210_1 is electrically connected to the row decoder 11. A first input terminal of the n-th row address signal latch 210_n is electrically connected to the n-th address signal line; a second input terminal of the n-th row address signal latch 210_n is electrically connected to the first latch signal line; and an output terminal of the n-th row address signal latch 210_n is electrically connected to the row decoder 11.

In accordance with the first latch signal (LAT1), each of the first to n-th row address signal latches 210_1 to 210_n which are included in the row address latch 21 illustrated in FIG. 10A can store a signal input to the first input terminal in the circuit. Further, each of the first to n-th row address signal latches 210_1 to 210_n can hold the signal and can output the signal to the row decoder 11. Thus, the row decoder 11 can select a desired row of the memory cell array 10.

Figure 10B:
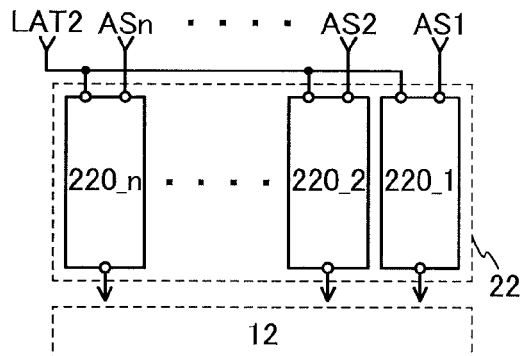

FIG. 10B illustrates a specific example of the above-described column address latch 22. Similarly, the column address latch 22 illustrated in FIG. 10B includes first to n-th column address signal latches 220_1 to 220_n. A first input terminal of the first column address signal latch 220_1 is electrically connected to the first address signal line; a second input terminal of the first column address signal latch 220_1 is electrically connected to a wiring (also referred to as a second latch signal line) supplying a second latch signal (LAT2); and an output terminal of the first column address signal latch 220_1 is electrically connected to the column decoder 12. A first input terminal of the n-th column address signal latch 220_n is electrically connected to the n-th address signal line; a second input terminal of the n-th column address signal latch 220_n is electrically connected to the second latch signal line; and an output terminal of the n-th column address signal latch 220_n is electrically connected to the column decoder 12.

In accordance with the second latch signal (LAT2), each of the first to n-th column address signal latches 220_1 to 220_n which are included in the column address latch 22 illustrated in FIG. 10B can store a signal input to the first input terminal in the circuit. Further, each of the first to n-th column address signal latches 220_1 to 220_n can hold the signal and output the signal to the column decoder 12. Thus, the column decoder 12 can select a desired column of the memory cell array 10.

Figure 10C:
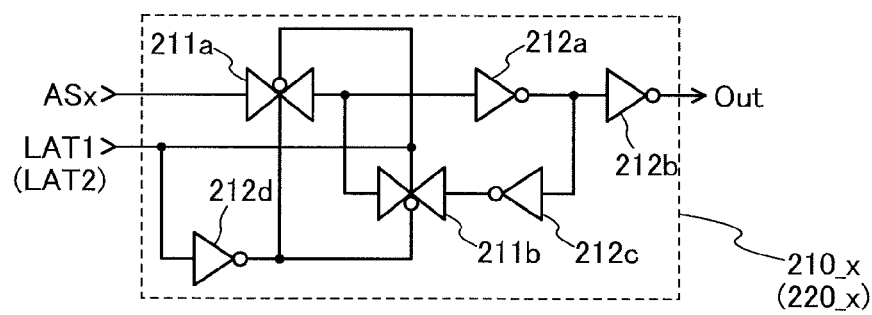

FIG. 10C illustrates a specific example of the x-th row address signal latch 210_x (x is a natural number of n or less) illustrated in FIG. 10A. The x-th row address signal latch 210_x illustrated in FIG. 10C includes a switch 211a, an inverter 212a, an inverter 212b, an inverter 212c, a switch 211b, and an inverter 212d. One of an input terminal and an output terminal of the switch 211a is electrically connected to the x-th address signal line. An input terminal of the inverter 212a is electrically connected to the other of the input terminal and the output terminal of the switch 211a. An input terminal of the inverter 212b is electrically connected to an output terminal of the inverter 212a, and an output terminal of the inverter 212b functions as an output terminal of the x-th row address signal latch 210_x. An input terminal of the inverter 212c is electrically connected to the output terminal of the inverter 212a and the input terminal of the inverter 212b. One of an input terminal and an output terminal of the switch 211b is electrically connected to an output terminal of the inverter 212c. The other of the input terminal and the output terminal of the switch 211b is electrically connected to the other of the input terminal and the output terminal of the switch 211a and the input terminal of the inverter 212a. An input terminal of the inverter 212d is electrically connected to the first latch signal line.

Figure 10D:
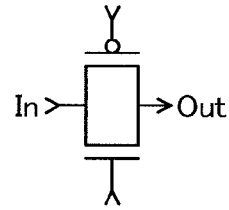
Figure 10E:
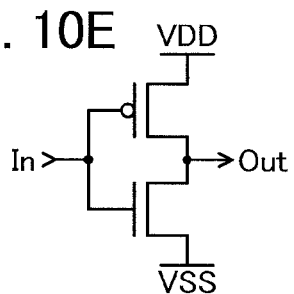

Note that a circuit illustrated in FIG. 10D can be applied to the switches 211a and 211b; a circuit illustrated in FIG. 10E can be applied to the inverters 212a, 212b, 212c, and 212d. Specifically, a switch illustrated in FIG. 10D includes a p-channel transistor and an n-channel transistor in each of which one of a source and a drain is electrically connected to an input terminal of the switch and the other of the source and the drain is electrically connected to an output terminal of the switch. Further, an inverter illustrated in FIG. 10E includes a p-channel transistor and an n-channel transistor. A gate, a source, and a drain of the p-channel transistor are electrically connected to an input terminal of the inverter, a wiring that supplies a high power supply potential (VDD), and an output terminal of the inverter, respectively. A gate, a source, and a drain of the n-channel transistor are electrically connected to the input terminal of the inverter, a wiring that supplies a low power supply potential (VSS), and the output terminal of the inverter, respectively. Note that as the n-channel transistors included in the circuits in FIGS. 10D and 10E, a transistor whose channel region is formed from an oxide semiconductor (OS) can be used.

A gate of the p-channel transistor included in the switch 211a is electrically connected to the first latch signal line. A gate of the n-channel transistor included in the switch 211a is electrically connected to the output terminal of the inverter 212d. Further, a gate of the p-channel transistor included in the switch 211b is electrically connected to the output terminal of the inverter 212d. A gate of the n-channel transistor included in the switch 211b is electrically connected to the first latch signal line.

Note that the same circuit as the x-th row address signal latch 210_x illustrated in FIG. 10C can be applied to the x-th column address signal latch 220_x illustrated in FIG. 10B. Note that the x-th column address signal latch 220_x is different from the x-th row address signal latch 210_x in that the second latch signal (LAT2), instead of the first latch signal (LAT1), is input (see the reference numerals in parentheses in FIG. 10C).

Figure 10F:
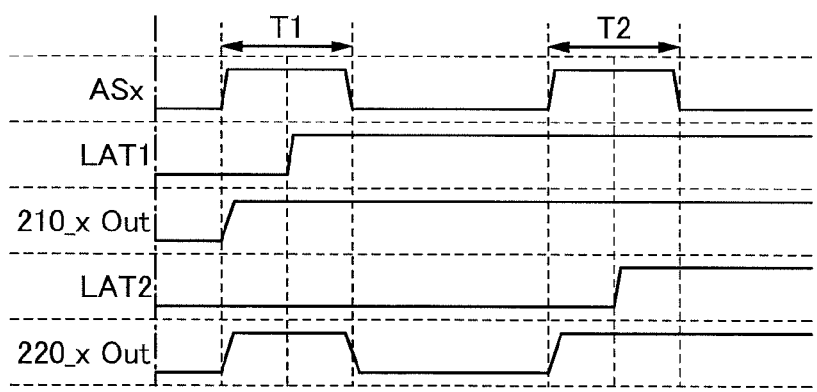

FIG. 10F shows potential changes of the following signals in a given period: the x-th address signal (ASx); the first latch signal (LAT1); the second latch signal (LAT2); an output signal (210_x Out) from the x-th row address signal latch 210_x; and an output signal (220_x Out) from the x-th column address signal latch 220_x. Note that in FIG. 10F, a period T1 is a period in which the x-th address signal (ASx) represents a row address signal and a period T2 is a period in which the x-th address signal (ASx) represents a column address signal. Note that a high-level potential of the x-th address signal (ASx) corresponds to a signal "1" and a low-level potential of the x-th address signal (ASx) corresponds to a signal "0". Both the potential of the row address signal represented by the x-th address signal (ASx) in the period T1 and the potential of the column address signal represented by the x-th address signal (ASx) in the period T2 are the high-level potentials (the signals "1").

The potential of the x-th address signal (ASx) is increased to the high-level potential in the initial stage of the period T1. At this time, both the potential of the first latch signal (LAT1) and the potential of the second latch signal (LAT2) are the low-level potentials. Thus, the switches 211a included in the x-th row address signal latch 210_x and the x-th column address signal latch 220_x are in an on state and the switches 211b included therein are in an off state. Accordingly, the potential of the output signal (210_x Out) from the x-th row address signal latch 210_x and the potential of the output signal (220_x Out) from the x-th column address signal latch 220_x are set to the high-level potentials (the signals "1").

Then, in the period T1, the potential of the first latch signal (LAT1) is increased to the high-level potential. Accordingly, the switch 211a included in the x-th row address signal latch 210_x is turned off and the switch 211b included in the x-th row address signal latch 210_x is turned on. Note that the above operation corresponds to storage of a row address signal in the x-th row address signal latch 210_x.

After that, the potential of the x-th address signal (ASx) is decreased to the low-level potential at the end of the period T1. Thus, the potential of the output signal (220_x Out) from the x-th column address signal latch 220_x whose switch 211a is in an on state is decreased to the low-level potential. On the other hand, the potential of the output signal (210_x Out) from the x-th row address signal latch 210_x whose switch 211a is in an off state is not decreased to the low-level potential. Further, since the switch 211b is in an on state (the signal "1"), the potential of the output signal (210_x Out) from the x-th row address signal latch 210_x is kept at the high-level potential (the signal "1").

Then, the potential of the x-th address signal (ASx) is increased to the high-level potential in the initial stage of the period T2. At this time, the potential of the first latch signal (LAT1) is the high-level potential, and the potential of the second latch signal (LAT2) is the low-level potential. Thus, the switch 211a and the switch 211b which are included in the x-th row address signal latch 210_x are in an off state and an on state, respectively; on the other hand, the switch 211a and the switch 211b which are included in the x-th column address signal latch 220_x are in an on state and an off state, respectively. Accordingly, the potential of the output signal (210_x Out) from the x-th row address signal latch 210_x is kept at the high-level potential (the signal "1") that is the potential of the row-address signal stored in the period T1; the potential of the output signal (220_x Out) from the x-th column address signal latch 220_x is increased to the high-level potential (the signal "1").

Then, the potential of the second latch signal (LAT2) is increased to the high-level potential in the period T2. Accordingly, the switch 211a included in the x-th column address signal latch 220_x is turned off and the switch 211b included in the x-th column address signal latch 220_x is turned on. Note that the above operation corresponds to storage of a column address signal in the x-th column address signal latch 220_x.

After that, the potential of the x-th address signal (ASx) is decreased to the low-level potential at the end of the period T2. However, the potentials of the output signals (210_x Out and 220_x Out) from the x-th row address signal latch 210_x and the x-th column address signal latch 220_x, in each of which the switch 211a is in an off state, are not decreased to the low-level potentials. Further, since the switches 211b are in an on state (the signal "1"), the potentials of the output signals (210_x Out and 220_x Out) from the x-th row address signal latch 210_x and the x-th column address signal latch 220_x are kept at the high-level potentials (the signals "1").

The above operation is performed in each of the first to n-th row address signal latches 210_1 to 210_n, whereby the row decoder 11 can select a desired row of the memory cell array 10 after the period T2. Further, the above operation is performed in each of the first to n-th column address signal latches 220_1 to 220_n, whereby the column decoder 12 can select a desired column of the memory cell array 10 after the period T2. In other words, any one of the plurality of memory cells 30 included in the memory cell array 10 can be selected.

<Specific Example 2 of Row Address Latch 21 and Column Address Latch 22>

Figure 11A:
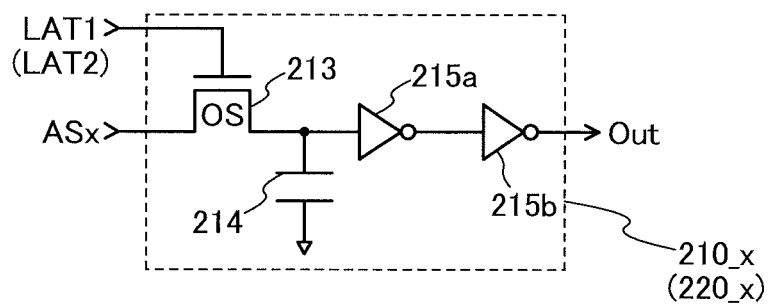
FIG. 11A illustrates specific examples of a row address signal latch and a column address signal latch.

FIG. 11A shows a specific example of the x-th row address signal latch 210_x, which is different from that in FIG. 10C. The x-th row address signal latch 210_x illustrated in FIG. 11A includes a transistor 213, a capacitor 214, an inverter 215a, and an inverter 215b. A gate of the transistor 213 is electrically connected to the first latch signal line, and one of a source and a drain of the transistor 213 is electrically connected to the x-th address signal line. One electrode of the capacitor 214 is electrically connected to the other of the source and the drain of the transistor 213, and the other electrode of the capacitor 214 is electrically connected to a fixed potential line. An input terminal of the inverter 215a is electrically connected to the other of the source and the drain of the transistor 213 and the one electrode of the capacitor 214. An input terminal of the inverter 215b is electrically connected to an output terminal of the inverter 215a. An output terminal of the inverter 215b functions as the output terminal of the x-th row address signal latch 210_x. Note that the transistor 213 is a transistor whose channel region is formed from an oxide semiconductor (OS). As a potential supplied to the fixed potential line, a ground potential (GND), 0 V, or the like can be employed. The circuit illustrated in FIG. 10E can be applied to the inverters 215a and 215b.

Note that the same circuit as the x-th row address signal latch 210_x illustrated in FIG. 11A can be applied to the x-th column address signal latch 220_x in FIG. 10B. Note that the x-th column address signal latch 220_x is different from the x-th row address signal latch 210_x x in that the second latch signal (LAT2), instead of the first latch signal (LAT1), is input (see the reference numerals in parentheses in FIG. 11A).

Figure 11B:
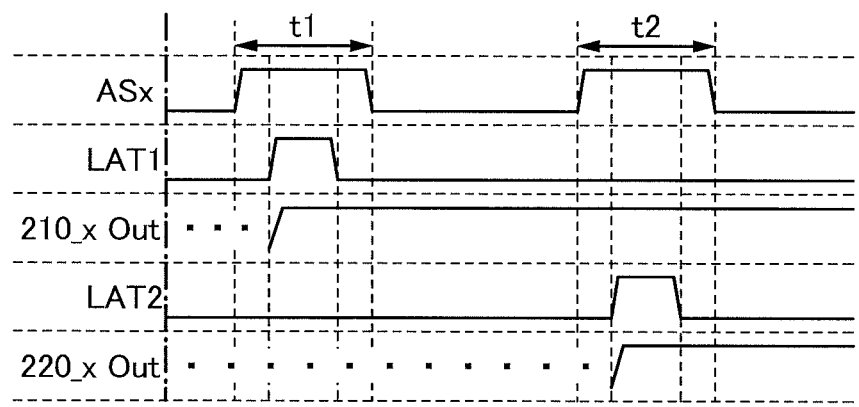
FIG. 11B illustrates a specific operation example of a row address latch and a column address latch.

FIG. 11B shows potential changes of the following signals in a given period: the x-th address signal (ASx); the first latch signal (LAT1); the second latch signal (LAT2); the output signal (210_x Out) from the x-th row address signal latch 210_x; and the output signal (220_x Out) from the x-th column address signal latch 220_x. Note that in FIG. 11B, a period t1 is a period in which the x-th address signal (ASx) represents a row address signal and a period t2 is a period in which the x-th address signal (ASx) represents a column address signal. Note that a high-level potential of the x-th address signal (ASx) corresponds to the signal "1" and a low-level potential of the x-th address signal (ASx) corresponds to the signal "0". Both the potential of the row address signal represented by the x-th address signal (ASx) in the period t1 and the potential of the column address signal represented by the x-th address signal (ASx) in the period t2 are the high-level potentials (the signals "1").

In the period t1, first, the potential of the x-th address signal (ASx) is increased to the high-level potential. At this time, both the potential of the first latch signal (LAT1) and the potential of the second latch signal (LAT2) are the low-level potentials.

Thus, the transistors 213 which are included in the x-th row address signal latch 210_x and the x-th column address signal latch 220_x are in an off state. Then, the potential of the first latch signal (LAT1) is increased to the high-level potential. Thus, the transistor 213 which is included in the x-th row address signal latch 210_x is turned on. Accordingly, the potential of the output signal (210_x Out) from the x-th row address signal latch 210_x becomes the high-level potential (the signal "1"). Then, the potential of the first latch signal (LAT1) is decreased to the low-level potential. Thus, the transistor 213 which is included in the x-th row address signal latch 210_x is turned off. As a result, a node to which the other of the source and the drain of the transistor 213 and the one electrode of the capacitor are electrically connected is brought into a floating state. Here, the potential of the node can be kept constant or substantially constant because the transistor 213 is a transistor whose channel region is formed from an oxide semiconductor (OS) and whose off-state current is extremely small. Accordingly, the potential of the output signal (210_x Out) from the x-th row address signal latch 210_x is kept at the high-level potential (the signal "1"). Note that the above operation (an operation related to the falling of the potential of the first latch signal (LAT1)) corresponds to storage of a row address signal in the x-th row address signal latch 210_x.

In the period t2, first, the potential of the x-th address signal (ASx) is increased to the high-level potential. At this time, both the potential of the first latch signal (LAT1) and the potential of the second latch signal (LAT2) are the low-level potentials. Thus, the transistors 213 which are included in the x-th row address signal latch 210_x and the x-th column address signal latch 220_x are in an off state. Then, the potential of the second latch signal (LAT2) is increased to the high-level potential. Thus, the transistor 213 which is included in the x-th column address signal latch 220_x is turned on. Accordingly, the potential of the output signal (220_x Out) from the x-th column address signal latch 220_x becomes the high-level potential (the signal "1"). Then, the potential of the second latch signal (LAT2) is decreased to the low-level potential. Thus, the transistor 213 which is included in the x-th column address signal latch 220_x is turned off. Accordingly, the potential of the output signal (220_x Out) from the x-th column address signal latch 220_x is kept at the high-level potential (the signal "1"). Note that the above operation (an operation related to the falling of the potential of the second latch signal (LAT2)) corresponds to storage of a column address signal in the x-th column address signal latch 220_x.

The above operation is performed in each of the first to n-th row address signal latches 210_1 to 210_n, whereby the row decoder 11 can select a desired row of the memory cell array 10 after the period t2. Further, the above-described operation is performed in each of the first to n-th column address signal latches 220_1 to 220_n, whereby the column decoder 12 can select a desired column of the memory cell array 10 after the period t2. In other words, any one of the plurality of memory cells 30 included in the memory cell array 10 can be selected.

In the case where the circuit illustrated in FIG. 11A is applied to the x-th row address signal latch 210_x and the x-th column address signal latch 220_x, the number of transistors can be smaller than the number of transistors in the case where the circuit illustrated in FIG. 10C is applied to the x-th row address signal latch 210_x and the x-th column address signal latch 220_x.

Note that it is also possible that the circuit illustrated in FIG. 10C is applied to one of the x-th row address signal latch 210_x and the x-th column address signal latch 220_x and the circuit illustrated in FIG. 11A is applied to the other of the x-th row address signal latch 210_x and the x-th column address signal latch 220_x. Further, it is also possible that the circuit illustrated in FIG. 10C is applied to in row address signal latches (m is a natural number less than n) which are included in the first to n-th row address signal latches 210_1 to 210_n and the circuit illustrated in FIG. 11A is applied to (n-m) row address signal latches. Similarly, it is also possible that the circuit illustrated in FIG. 10C is applied to m column address signal latches which are included in the first to n-th column address signal latches 220_1 to 220_n and the circuit illustrated in FIG. 11A is applied to (n-m) column address signal latches.

<Specific Example of Transistor Included in Semiconductor Device>

An example of a transistor included in the above semiconductor device is described below. Specifically, an example of a transistor formed using a substrate containing a semiconductor material and a transistor formed using an oxide semiconductor will be described.

Figure 12:
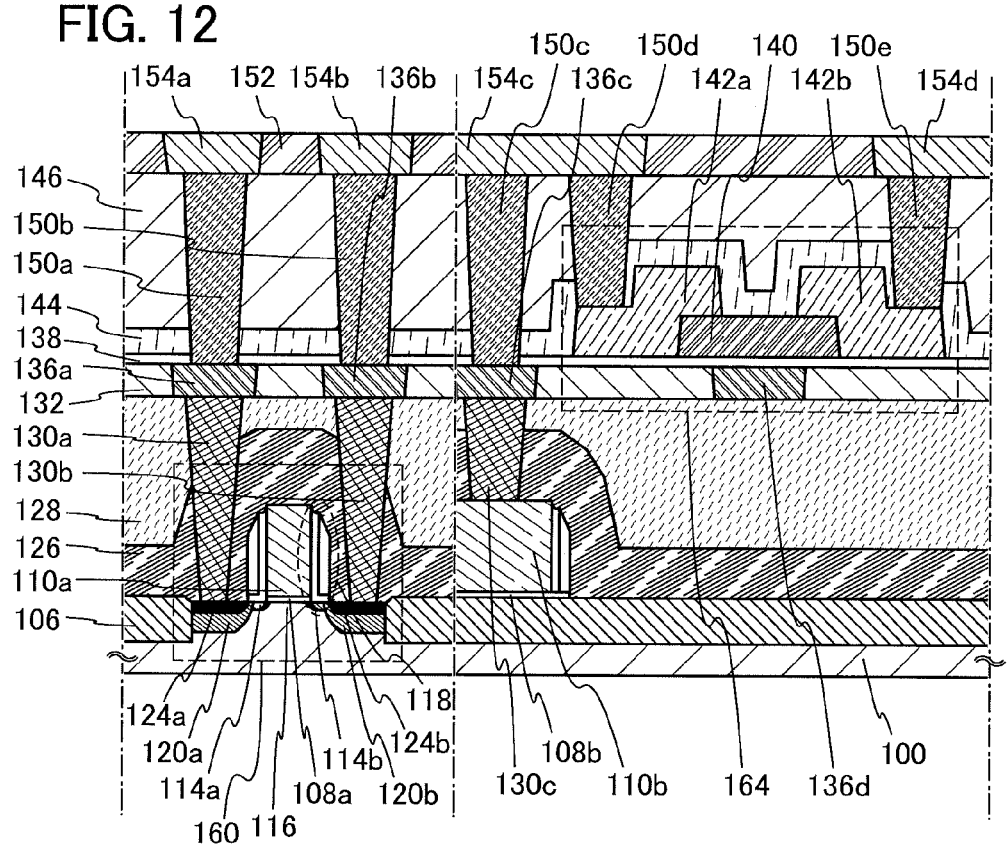
FIG. 12 illustrates a specific example of a transistor.

A transistor 160 illustrated in FIG. 12 includes a channel region 116 provided over a substrate 100 containing a semiconductor material, a pair of impurity regions 114a and 114b and a pair of high concentration impurity regions 120a and 120b (these regions are also collectively referred to simply as impurity regions) which are provided so that the channel region 116 is interposed therebetween, a gate insulating film 108a provided over the channel region 116, a gate layer 110a provided over the gate insulating film 108a, a source layer 130a which is electrically connected to the impurity region 114a, and a drain layer 130b which is electrically connected to the impurity region 114b.

Note that sidewall insulating layers 118 are provided on side surfaces of the gate layer 110a. The substrate 100 containing a semiconductor material is provided with the pair of high concentration impurity regions 120a and 120b in regions which do not overlap with the sidewall insulating layers 118. The substrate 100 is also provided with a pair of metal compound regions 124a and 124b over the pair of high concentration impurity regions 120a and 120b. Element isolation insulating layers 106 are provided over the substrate 100 so as to surround the transistor 160. An interlayer insulating layer 126 and an interlayer insulating layer 128 are provided so as to cover the transistor 160. The source layer 130a is electrically connected to the metal compound region 124a through an opening formed in the interlayer insulating layer 126 and the interlayer insulating layer 128, and the drain layer 130b is electrically connected to the metal compound region 124b through an opening formed in the interlayer insulating layer 126 and the interlayer insulating layer 128. That is, the source layer 130a is electrically connected to the high concentration impurity region 120a and the impurity region 114a through the metal compound region 124a, and the drain layer 130b is electrically connected to the high concentration impurity region 120b and the impurity region 114b through the metal compound region 124b.

In addition, as layers below a transistor 164 described later, there are an insulating layer 108b containing the same material as the gate insulating film 108a, an electrode layer 110b containing the same material as the gate layer 110a, and an electrode layer 130c containing the same material as the source layer 130a and the drain layer 130b.

The transistor 164 illustrated in FIG. 12 includes a gate layer 136d provided over the interlayer insulating layer 128, a gate insulating film 138 provided over the gate layer 136d, an oxide semiconductor layer 140 provided over the gate insulating film 138, and a source layer 142a and a drain layer 142b which are provided over the oxide semiconductor layer 140 and electrically connected to the oxide semiconductor layer 140.

Here, the gate layer 136d is provided to be embedded in an insulating layer 132 formed over the interlayer insulating layer 128. Like the gate layer 136d, an electrode layer 136a and an electrode layer 136b are formed, which are respectively in contact with the source layer 130a and the drain layer 130b included in the transistor 160. In addition, an electrode layer 136c in contact with the electrode layer 130c is formed.

A protective insulating layer 144 is provided over the transistor 164 so as to be in contact with part of the oxide semiconductor layer 140. An interlayer insulating layer 146 is provided over the protective insulating layer 144. Here, openings reaching the source layer 142a and the drain layer 142b are provided in the protective insulating layer 144 and the interlayer insulating layer 146. An electrode layer 150d and an electrode layer 150e are formed, which are respectively in contact with the source layer 142a and the drain layer 142b through the openings. Like the electrode layers 150d and 150e, an electrode layer 150a, an electrode layer 150b, and an electrode layer 150c are formed, which are respectively in contact with the electrode layer 136a, the electrode layer 136b, and the electrode layer 136c through openings provided in the gate insulating film 138, the protective insulating layer 144, and the interlayer insulating layer 146.

The oxide semiconductor layer 140 is highly purified by sufficiently removing an impurity such as hydrogen therein. Specifically, the hydrogen concentration in the oxide semiconductor layer 140 is $5 \times 10^{19}$ atoms/cm$^3$ or less. Note that the preferable hydrogen concentration in the oxide semiconductor layer 140 is $5 \times 10^{18}$ atoms/cm$^3$ or less, far preferably $5 \times 10^{17}$ atoms/cm$^3$ or less. The transistor 164 with excellent off-state current characteristics can be obtained with the use of the oxide semiconductor layer 140 that is highly purified by a sufficient reduction in hydrogen concentration.

For example, in the case where the drain voltage Vd is +1 V or +10 V, the leakage current is $1 \times 10^{-13}$ [A] or less. Applying the highly purified oxide semiconductor layer 140 with a sufficiently reduced hydrogen concentration allows a reduction in the leakage current of the transistor 164. The hydrogen concentration in the oxide semiconductor layer 140 is measured by secondary ion mass spectroscopy (SIMS).

Further, an insulating layer 152 is provided over the interlayer insulating layer 146, and an electrode layer 154a, an electrode layer 154b, an electrode layer 154c, and an electrode layer 154d are provided so as to be embedded in the insulating layer 152. Note that the electrode layer 154a is in contact with the electrode layer 150a, the electrode layer 154b is in contact with the electrode layer 150b, the electrode layer 154c is in contact with the electrode layer 150c and the electrode layer 150d, and the electrode layer 154d is in contact with the electrode layer 150e.

The source layer 130a in the transistor 160 illustrated in FIG. 12 is electrically connected to the electrode layers 136a, 150a, and 154a which are provided in the upper region. Thus, conductive layers for the above-described electrode layers are formed as appropriate, whereby the source layer 130a in the transistor 160 can be electrically connected to any of the electrode layers included in the transistor 164 provided in the upper region. The drain layer 130b in the transistor 160 can also be electrically connected to any of the electrode layers included in the transistor 164 provided in the upper region. Although not illustrated in FIG. 12, the gate layer 110a in the transistor 160 can be electrically connected to any of the electrode layers included in the transistor 164 through an electrode layer provided in the upper region.

Similarly, the source layer 142a in the transistor 164 illustrated in FIG. 12 is electrically connected to the electrode layers 130c and 110b provided in the lower region. Thus, conductive layers for the above-described electrode layers are formed as appropriate, whereby the source layer 142a in the transistor 164 can be electrically connected to any of the gate layer 110a, the source layer 130a, and the drain layer 130b which are included in the transistor 160 provided in the lower region. Although not illustrated in FIG. 12, the gate layer 136d or the drain layer 142b in the transistor 164 can be electrically connected to any of the electrode layers included in the transistor 160 through an electrode layer provided in the lower region.

<Example of Steps for Fabricating Transistor>

Next, examples of methods for fabricating the transistor 160 and the transistor 164 will be described. Hereinafter, a method for fabricating the transistor 160 is described first with reference to FIGS. 13A to 13H, and a method for fabricating the transistor 164 is then described with reference to FIGS. 14A to 14G and FIGS. 15A to 15D.

Figure 13A:
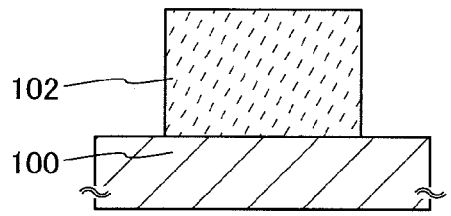
FIGS. 13A to 13H illustrate a specific example of steps of fabricating a transistor.
Figure 13E:
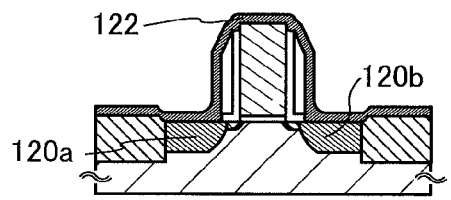

First, the substrate 100 containing a semiconductor material is prepared (see FIG. 13A). As the substrate 100 containing a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 containing a semiconductor material is described. Note that in general, the "SOI substrate" means a substrate in which a silicon semiconductor layer is provided on an insulating surface. In this specification and the like, the "SOI substrate"

also includes a substrate in which a semiconductor layer containing a material other than silicon is provided over an insulating surface in its category. That is, a semiconductor layer included in the "SOI substrate" is not limited to a silicon semiconductor layer. Further, the "SOI substrate" includes a structure in which a semiconductor layer is formed over an insulating substrate such as a glass substrate with an insulating layer interposed therebetween.

A protective layer 102 serving as a mask for forming an element isolation insulating layer is formed over the substrate 100 (see FIG. 13A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the semiconductor device. When the semiconductor is formed using silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 13B). As the etching, dry etching is preferably performed, but wet etching can be performed. An etching gas and an etchant can be selected as appropriate depending on a material to be etched.

Figure 13B:
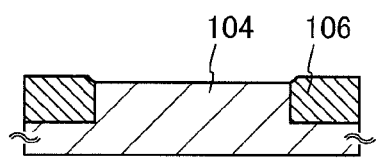
Figure 13F:
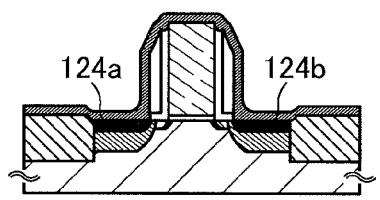

Then, an insulating layer is formed so as to cover the semiconductor region 104, and the insulating layer in a region overlapping with the semiconductor region 104 is selectively removed, so that the element isolation insulating layers 106 are formed (see FIG. 13B). The insulating layer is formed using silicon oxide, silicon nitride, silicon nitride oxide, or the like. As a method for removing the insulating layer, polishing treatment such as chemical mechanical polishing (CMP), etching, or the like can be given, and any of the above treatment may be used. Note that the protective layer 102 is removed after the formation of the semiconductor region 104 or after the formation of the element isolation insulating layers 106.

Next, an insulating layer is formed over the semiconductor region 104, and a layer containing a conductive material is formed over the insulating layer.

The insulating layer serves as a gate insulating film later and preferably has a single-layer structure or a layered structure using a film containing silicon oxide, silicon nitride oxide, silicon nitride, hafnium oxide, aluminum oxide, tantalum oxide, or the like which is obtained by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer; the insulating layer can have a thickness of greater than or equal to 1 nm and less than or equal to 100 nm, for example.

The layer containing a conductive material can be formed using a metal material such as aluminum, copper, titanium, tantalum, or tungsten. The layer containing a conductive material may be formed using a semiconductor material such as polycrystalline silicon containing a conductive material. There is no particular limitation on the method for forming the layer containing a conductive material, and a variety of film formation methods such as an evaporation method, a CVD method, a sputtering method, or a spin coating method can be employed. Here, an example of the case where the layer containing a conductive material is formed using a metal material is described.

Figure 13C:
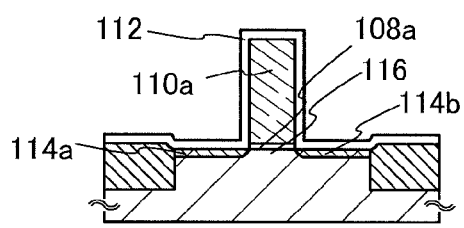

After that, the insulating layer and the layer containing a conductive material are selectively etched, so that the gate insulating film 108a and the gate layer 110a are formed (see FIG. 13C).

Next, an insulating layer 112 that covers the gate layer 110a is formed (see FIG. 13C). Then, boron (B), phosphorus (P), arsenic (As), or the like is added to the semiconductor region 104, so that the pair of impurity regions 114a and 114b with a shallow junction are formed (see FIG. 13C). Note that by formation of the pair of impurity regions 114a and 114b, the channel region 116 is formed in the semiconductor region 104 below the gate insulating film 108a (see FIG. 13C). Here, the concentration of the impurity added can be set as appropriate; the concentration is preferably increased when the size of a semiconductor element is extremely decreased. Although the pair of impurity regions 114a and 114b are formed after formation of the insulating layer 112 here, the insulating layer 112 may be formed after formation of the pair of impurity regions 114a and 114b.

Figure 13G:
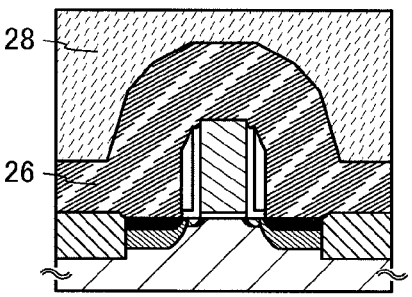
Figure 13D:
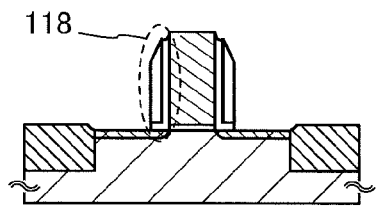

Next, the sidewall insulating layers 118 are formed (see FIG. 13D). An insulating layer is formed so as to cover the insulating layer 112 and then subjected to highly anisotropic etching, whereby the sidewall insulating layers 118 can be formed in a self-aligned manner. At this time, by partly etching the insulating layer 112, an upper surface of the gate layer 110a and upper surfaces of the impurity regions 114a and 114b are preferably exposed.

Next, an insulating layer is formed so as to cover the gate layer 110a, the pair of impurity regions 114a and 114b, the sidewall insulating layers 118, and the like. Then, boron (B), phosphorus (P), arsenic (As), or the like is added to part of the impurity regions 114a and 114b, so that the pair of high concentration impurity regions 120a and 120b are formed (see FIG. 13E). After that, the insulating layer is removed, and a metal layer 122 is formed so as to cover the gate layer 110a, the sidewall insulating layers 118, the pair of high concentration impurity regions 120a and 120b, and the like (see FIG. 13E). The metal layer 122 can be formed by a variety of methods, such as a vacuum evaporation method, a sputtering method, and a spin coating method. The metal layer 122 is preferably formed using a metal material that reacts with a semiconductor material contained in the semiconductor region 104 to be a low-resistance metal compound. Examples of such metal materials include titanium, tantalum, tungsten, nickel, cobalt, and platinum.

Next, heat treatment is performed, so that the metal layer 122 reacts with the semiconductor material. By this heat treatment, the pair of metal compound regions 124a and 124b in contact with the pair of high concentration impurity regions 120a and 120b are formed (see FIG. 13F). Note that when the gate layer 110a is formed using polycrystalline silicon or the like, a metal compound region is also formed in a region of the gate layer 110a in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the pair of metal compound regions 124a and 124b are formed.

Then, the interlayer insulating layer 126 and the interlayer insulating layer 128 are formed so as to cover the components formed in the above steps (see FIG. 13G). The interlayer insulating layers 126 and 128 can be formed using a material containing an inorganic insulating material such as silicon oxide, silicon nitride oxide, silicon nitride, hafnium oxide, aluminum oxide, or tantalum oxide. Alternatively, the interlayer insulating layers 126 and 128 can be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized by CMP, etching, or the like.

Figure 13H:
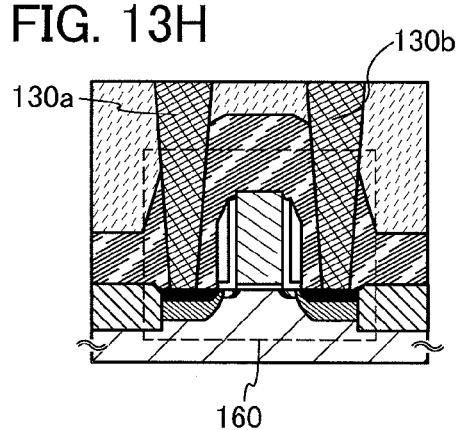

After that, openings reaching the pair of metal compound regions 124a and 124b are formed in the interlayer insulating layers, and the source layer 130a and the drain layer 130b are formed in the openings (see FIG. 13H). A conductive layer is formed by a PVD method, a CVD method, or the like in a region including the openings, and part of the conductive layer is removed by etching or CMP, so that the source layer 130a and the drain layer 130b can be formed.

It is preferable that the source layer 130a and the drain layer 130b be formed to have a planar surface. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. In such a manner, the surface including the source layer 130a and the drain layer 130b is planarized, whereby an electrode, a wiring, an insulating layer, a semiconductor layer, and the like can be favorably formed in later steps.

Note that here, only the source layer 130a and the drain layer 130b which are in contact with the pair of metal compound regions 124a and 124b are illustrated; however, an electrode layer serving as a wiring (e.g., the electrode layer 130c in FIG. 12) or the like can be formed together in this step. There is no particular limitation on a material for forming the source layer 130a and the drain layer 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 containing a semiconductor material is formed. Note that an electrode, a wiring, an insulating layer, or the like may be further formed after the above step. When the wiring has a multilayer wiring structure which is a layered structure including an interlayer insulating layer and a conductive layer, a highly integrated circuit can be provided.

Next, steps for fabricating the transistor 164 over the interlayer insulating layer 128 will be described with reference to FIGS. 14A to 14G and FIGS. 15A to 15D. Note that FIGS. 14A to 14G and FIGS. 15A to 15D illustrate steps for fabricating various electrode layers, the transistor 164, and the like over the interlayer insulating layer 128, and description of the transistor 160 and the like placed below the transistor 164 is omitted.

Figure 14A:
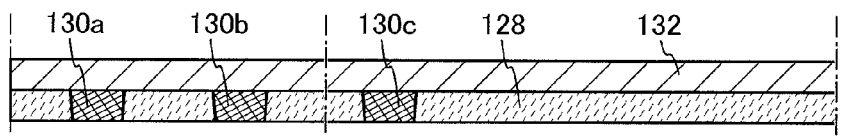
FIGS. 14A to 14G illustrate a specific example of steps of fabricating a transistor.
Figure 14B:
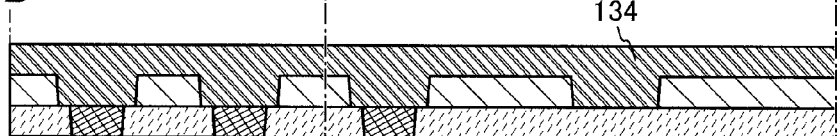

First, the insulating layer 132 is formed over the interlayer insulating layer 128, the source layer 130a, the drain layer 130b, and the electrode layer 130c (see FIG. 14A). The insulating layer 132 can be formed by a PVD method, a CVD method, or the like. The insulating layer 132 can be formed using a material containing an inorganic insulating material such as silicon oxide, silicon nitride oxide, silicon nitride, hafnium oxide, aluminum oxide, or tantalum oxide.

Next, openings that reach the source layer 130a, the drain layer 130b, and the electrode layer 130c are formed in the insulating layer 132. At this time, another opening is formed in a region where the gate layer 136d is to be formed later. Then, a conductive layer 134 is formed to be embedded in the openings (see FIG. 14B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of deoxidizing an oxide film at an interface so as to reduce contact resistance to the lower electrode layers (here, the source layer 130a, the drain layer 130b, the electrode layer 130c, and the like). The titanium nitride film formed after the formation of the titanium film has a barrier function of preventing diffusion of the conductive material. A copper film may be formed by a plating method after the formation of the barrier film of titanium, titanium nitride, or the like.

Figure 14C:
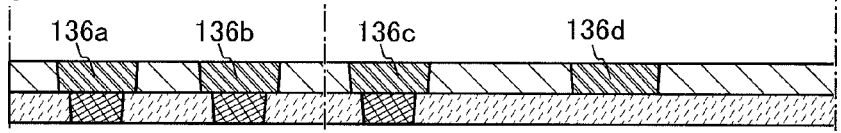

After the conductive layer 134 is formed, part of the conductive layer 134 is removed by etching, CMP, or the like, so that the insulating layer 132 is exposed and the electrode layers 136a, 136b, and 136c, and the gate layer 136d are formed (see FIG. 14C). Note that when the electrode layers 136a, 136b, and 136c, and the gate layer 136d are formed by removing part of the conductive layer 134, it is preferable that a planar surface be formed. By planarizing the surfaces of the insulating layer 132, the electrode layers 136a, 136b, and 136c, and the gate layer 136d in such a manner, an electrode, a wiring, an insulating layer, a semiconductor layer, or the like can be favorably formed in a later step.

Figure 14D:
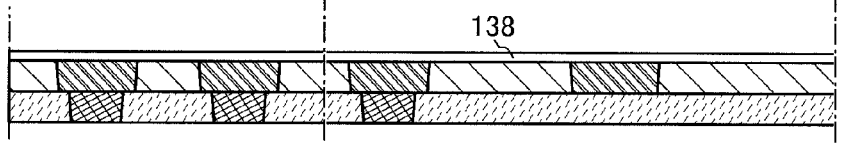

Next, the gate insulating film 138 is formed so as to cover the insulating layer 132, the electrode layers 136a, 136b, and 136c, and the gate layer 136d (see FIG. 14D). The gate insulating film 138 can be formed by a CVD method, a sputtering method, or the like. The gate insulating film 138 is preferably formed using silicon oxide, silicon nitride, silicon oxynitride, silicon nitride oxide, aluminum oxide, hafnium oxide, tantalum oxide, or the like. Note that the gate insulating film 138 may have a single-layer structure or a layered structure. For example, the gate insulating film 138 made of silicon oxynitride can be formed by a plasma-enhanced CVD method using silane ($SiH_4$), oxygen, and nitrogen as a source gas. There is no particular limitation on the thickness of the gate insulating film 138; the gate insulating film 138 can have a thickness of greater than or equal to 10 nm and less than or equal to 500 nm, for example. When a layered structure is employed, the gate insulating film 138 is preferably formed by stacking a first gate insulating film with a thickness of greater than or equal to 50 nm and less than or equal to 200 nm and a second gate insulating film with a thickness of greater than or equal to 5 nm and less than or equal to 300 nm over the first gate insulating layer, for example.

Note that an oxide semiconductor which is made to be an i-type oxide semiconductor or a substantially i-type oxide semiconductor by removing an impurity (an oxide semiconductor which is highly purified) is extremely sensitive to an interface state or to the interface electric charge; thus, when such an oxide semiconductor is used for an oxide semiconductor layer, an interface between the oxide semiconductor layer and a gate insulating film is important. In other words, the gate insulating film 138 that is to be in contact with a highly purified oxide semiconductor layer needs to have high quality.

For example, the gate insulating film 138 is preferably fanned by a high-density plasma-enhanced CVD method using microwaves (2.45 GHz) because the gate insulating film 138 can be dense and have high withstand voltage and high quality. The highly purified oxide semiconductor layer and the high-quality gate insulating film are in close contact with each other, so that interface state density can be reduced and favorable interface characteristics can be obtained.

It is needless to say that, even when a highly purified oxide semiconductor layer is used, another method such as a sputtering method or a plasma-enhanced CVD method can be employed as long as a high-quality insulating layer can be formed as a gate insulating film. Moreover, it is possible to use an insulating layer whose quality and interface characteristics are improved with heat treatment performed after the formation of the insulating layer. In any case, a layer is acceptable which is of good quality as the gate insulating film 138, and which reduces interface state density between the gate insulating film and the oxide semiconductor layer so that a good interface is formed.

Figure 14E:
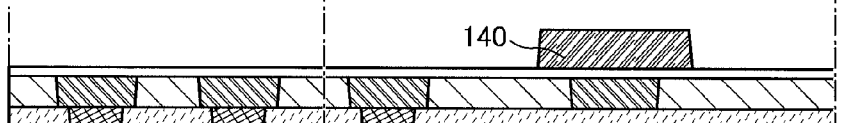

Next, an oxide semiconductor layer is formed over the gate insulating film 138 and processed by etching using a mask or the like, so that the island-shaped oxide semiconductor layer 140 is formed (see FIG. 14E).

The oxide semiconductor layer contains at least one element selected from In, Ga, Sn, Zn, Al, Mg, Hf, and lanthanoid. For example, an In—Sn—Ga—Zn-based oxide semiconductor layer, an In—Ga—Zn-based oxide semiconductor layer, an In—Sn—Zn-based oxide semiconductor layer, an In—Al—Zn-based oxide semiconductor layer, a Sn—Ga—Zn-based oxide semiconductor layer, an Al—Ga—Zn-based oxide semiconductor layer, a Sn—Al—Zn-based oxide semiconductor layer, an In—Hf—Zn-based oxide semiconductor layer, an In—La—Zn-based oxide semiconductor layer, an In—Ce—Zn-based oxide semiconductor layer, an In—Pr—Zn-based oxide semiconductor layer, an In—Nd—Zn-based oxide semiconductor layer, an In—Sm—Zn-based oxide semiconductor layer, an In—Eu—Zn-based oxide semiconductor layer, an In—Gd—Zn-based oxide semiconductor layer, an In—Tb—Zn-based oxide semiconductor layer, an In—Dy—Zn-based oxide semiconductor layer, an In—Ho—Zn-based oxide semiconductor layer, an In—Er—Zn-based oxide semiconductor layer, an In—Tm—Zn-based oxide semiconductor layer, an In—Yb—Zn-based oxide semiconductor layer, an In—Lu—Zn-based oxide semiconductor layer, a Zn—Mg-based oxide semiconductor layer, a Sn—Mg-based oxide semiconductor layer, an In—Mg-based oxide semiconductor layer, an In—Ga-based oxide semiconductor layer, an In—Zn-based oxide semiconductor layer, a Sn—Zn-based oxide semiconductor layer, an Al—Zn-based oxide semiconductor layer, an In-based oxide semiconductor layer, a Sn-based oxide semiconductor layer, or a Zn-based oxide semiconductor layer is used. In particular, an amorphous oxide semiconductor layer is preferable. Here, as the oxide semiconductor layer, an amorphous oxide semiconductor layer is formed by a sputtering method using an In—Ga—Zn-based metal oxide target. The addition of silicon to an amorphous oxide semiconductor layer suppresses the crystallization of the layer; thus, the oxide semiconductor layer can be formed using a target containing $SiO_2$ at greater than or equal to 2 wt % and less than or equal to 10 wt %, for example.

As a target used for forming an oxide semiconductor layer by sputtering, a metal oxide target containing zinc oxide or the like as its main component can be used, for example. A metal oxide target containing In, Ga, and Zn (as the composition ratio, the ratio of $In_2O_3$ to $Ga_2O_3$ and ZnO is 1:1:1 [molar ratio], or the ratio of In to Ga and Zn is 1:1:0.5 [atomic ratio]) can also be used, for example. As the metal oxide target containing In, Ga, and Zn, a target in which the composition ratio of In to Ga and Zn is 1:1:1 [atomic ratio] or a target in which the composition ratio of In to Ga and Zn is 1:1:2 [atomic ratio] may also be used. The filling rate of the metal oxide target is greater than or equal to 90% and less than or equal to 100%, preferably 95% (for example, 99.9%) or more. A dense oxide semiconductor layer is formed by using a metal oxide target with a high filling rate.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, a high-purity gas is preferably used, in which an impurity such as hydrogen, water, hydroxyl, or hydride is reduced to approximately several parts per million (ppm) (preferably approximately several parts per billion (ppb)).

In forming the oxide semiconductor layer, the substrate is held in a treatment chamber that is maintained at reduced pressure and the substrate temperature is set to higher than or equal to 100° C. and lower than or equal to 600° C., preferably higher than or equal to 200° C. and lower than or equal to 400° C. The oxide semiconductor layer is formed while the substrate is heated, so that the impurity concentration in the oxide semiconductor layer can be reduced. In addition, damage by sputtering can be reduced. Then, a sputtering gas from which hydrogen and water are removed is introduced into the treatment chamber from which remaining moisture is being removed, and the oxide semiconductor layer is formed using metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. In the deposition chamber that is evacuated with the cryopump, a hydrogen atom and a compound containing a hydrogen atom, such as water ($H_2O$) (and preferably also a compound containing a carbon atom), for example, are removed; thus, the concentration of an impurity contained in the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the proportion of the oxygen flow is 100%). Note that the use of a pulse direct-current (DC) power source is preferable in that it reduces dust and in that it makes the film thickness even. The thickness of the oxide semiconductor layer is greater than or equal to 2 nm and less than or equal to 200 nm, preferably greater than or equal to 5 nm and less than or equal to 30 nm. Note that an appropriate thickness differs depending on an oxide semiconductor material, and the thickness is set as appropriate depending on the material to be used.

Note that before the oxide semiconductor layer is formed by sputtering, dust on a surface of the gate insulating film 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

As a method for etching the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

Examples of the etching gas for dry etching are a gas containing chlorine (a chlorine-based gas such as chlorine ($Cl_2$), boron trichloride ($BCl_3$), silicon tetrachloride ($SiCl_4$), or carbon tetrachloride ($CCl_4$)) and the like. Further, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, or the like can be used. Further, an etchant such as ITO-07N (produced by KANTO CHEMICAL CO., INC.) may be used.

Then, first heat treatment is preferably performed on the oxide semiconductor layer. The oxide semiconductor layer can be dehydrated or dehydrogenated by the first heat treatment. The temperature of the first heat treatment is higher than or equal to 300° C. and lower than or equal to 750° C., preferably higher than or equal to 400° C. and lower than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or more, preferably 7N (99.99999%) or more (i.e., the impurity concentration is 1 ppm or less, preferably 0.1 ppm or less).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline semiconductor layer with a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, the oxide semiconductor layer sometimes becomes a layer in which a microcrystal (with a grain size greater than or equal to 1 nm and less than or equal to 20 nm, typically greater than or equal to 2 nm and less than or equal to 4 nm) is mixed in an amorphous oxide semiconductor (e.g., a surface of the oxide semiconductor layer).

The electrical characteristics of the oxide semiconductor layer can be changed by aligning microcrystals in an amorphous semiconductor. For example, in the case where the oxide semiconductor layer is formed using an In—Ga—Zn-based metal oxide target, the electrical characteristics of the oxide semiconductor layer can be changed by forming, in the oxide semiconductor layer, a microcrystalline portion where crystal grains of $In_2Ga_2ZnO_7$ having electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography process is performed.

Note that the heat treatment can also be called dehydration treatment, dehydrogenation treatment, or the like because it is effective in dehydrating or dehydrogenating the oxide semiconductor layer 140. It is possible to perform such dehydration treatment or dehydrogenation treatment, for example, after forming the oxide semiconductor layer, after stacking source and drain layers over the oxide semiconductor layer 140, or after forming a protective insulating layer over the source and drain layers. Such dehydration treatment or dehydrogenation treatment may be conducted once or plural times.

Figure 14F:
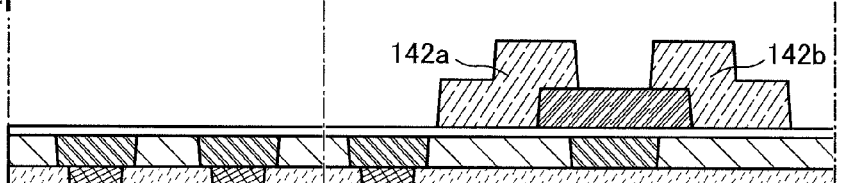

Next, the source layer 142a and the drain layer 142b are formed so as to be in contact with the oxide semiconductor layer 140 (see FIG. 14F). A conductive layer is formed so as to cover the oxide semiconductor layer 140 and then selectively etched, so that the source layer 142a and the drain layer 142b can be formed.

The conductive layer can be formed by a CVD method such as a plasma-enhanced CVD method or a PVD method including a sputtering method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in that order.

Here, ultraviolet light, KrF laser light, or ArF laser light is preferably used for light exposure in forming a mask used for etching.

The channel length (L) of the transistor is determined by a distance between a lower edge portion of the source layer 142a and a lower edge portion of the drain layer 142b. Note that in the case where the channel length (L) is less than 25 nm, light exposure for forming a mask is performed with extreme ultraviolet rays whose wavelength is extremely short of several nanometers to several tens of nanometers. In the light exposure with extreme ultraviolet light, the resolution is high and the focus depth is large. For these reasons, the channel length (L) of the transistor to be formed later can be greater than or equal to 10 nm and less than or equal to 1000 nm, and the circuit can operate at higher speed.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source layer 142a or between the oxide semiconductor layer 140 and the drain layer 142b. It is possible to successively form the oxide conductive layer and a metal layer which is to be the source layer 142a and the drain layer 142b (successive formation). The oxide conductive layer can function as a source region or a drain region. The placement of such an oxide conductive layer can reduce the resistance of the source region and the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; accordingly, the resist mask can be used in a plurality of etching steps for processing into different patterns. That is, a resist mask corresponding to at least two kinds of different patterns can be formed using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Plasma treatment may be performed using a mixed gas of oxygen and argon as well.

Figure 14G:
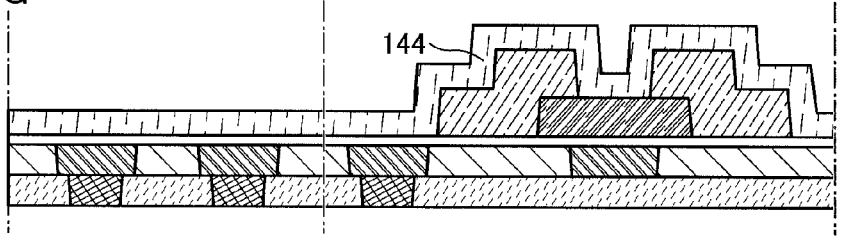

Next, the protective insulating layer 144 is formed in contact with part of the oxide semiconductor layer 140 without exposure to the air (see FIG. 14G).

The protective insulating layer 144 can be formed by a method by which an impurity such as water and hydrogen is prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature for forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

When hydrogen is contained in the protective insulating layer 144, entry of the hydrogen to the oxide semiconductor layer 140 or extraction of oxygen in the oxide semiconductor layer 140 by the hydrogen is caused, thereby making the resistance on the backchannel side of the oxide semiconductor layer 140 low, so that a parasitic channel might be formed. Therefore, it is important not to use hydrogen in forming the protective insulating layer 144 so that the protective insulating layer 144 contains hydrogen as little as possible.

It is preferable to form the protective insulating layer 144 while removing moisture remaining in the treatment chamber. This is for preventing hydrogen, hydroxyl, or moisture from entering the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber that is evacuated with the cryopump, a hydrogen atom and a compound containing a hydrogen atom, such as water ($H_2O$), for example, are removed; thus, the concentration of an impurity contained in the protective insulating layer 144 formed in the deposition chamber can be reduced.

A sputtering gas used for the deposition of the protective insulating layer 144 is preferably a high-purity gas in which an impurity such as hydrogen, water, hydroxyl, or hydride is reduced to approximately several parts per million (ppm) (preferably approximately several parts per billion (ppb)).

Next, second heat treatment is preferably performed in an inert gas atmosphere or an oxygen gas atmosphere (at higher than or equal to 200° C. and lower than or equal to 400° C., for example, at higher than or equal to 250° C. and lower than or equal to 350° C.). For example, the second heat treatment is performed at 250° C. for one hour in a nitrogen atmosphere. The second heat treatment can reduce variation in electrical characteristics of the transistor.

Furthermore, heat treatment may be performed at higher than or equal to 100° C. and lower than or equal to 200° C. in the air for longer than or equal to one hour and shorter than or equal to 30 hours. This heat treatment can be performed at a fixed heating temperature or follow temperature cycles where the temperature repeatedly rises from room temperature to a heating temperature higher than or equal to 100° C. and lower than or equal to 200° C. and drops from the heating temperature to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 15A:
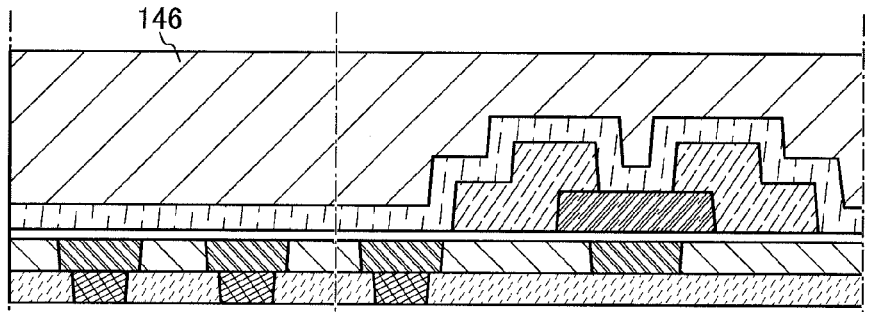
FIGS. 15A to 15D illustrate a specific example of steps of fabricating a transistor.
Figure 15B:
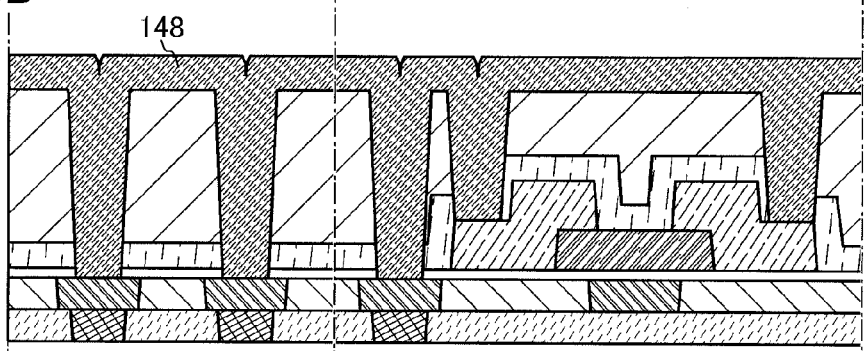

Next, the interlayer insulating layer 146 is formed over the protective insulating layer 144 (see FIG. 15A). The interlayer insulating layer 146 can be formed by a PVD method, a CVD method, or the like. The interlayer insulating layer 146 can be formed using a material containing an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized by CMP, etching, or the like.

Next, openings reaching the electrode layers 136a, 136b, and 136c, the source layer 142a, and the drain layer 142b are formed in the interlayer insulating layer 146, the protective insulating layer 144, and the gate insulating film 138. Then, a conductive layer 148 is formed to be embedded in the openings (see FIG. 15B). The openings can be formed by a method such as etching using a mask. The mask can be found by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of deoxidizing an oxide film at an interface so as to reduce contact resistance to the lower electrodes (here, the electrode layers 136a, 136b, and 136c, the source layer 142a, and the drain layer 142b). The titanium nitride film farmed after the formation of the titanium film has a barrier function of preventing diffusion of the conductive material. A copper film may be formed by a plating method after the formation of the barrier film of titanium, titanium nitride, or the like.

Figure 15C:
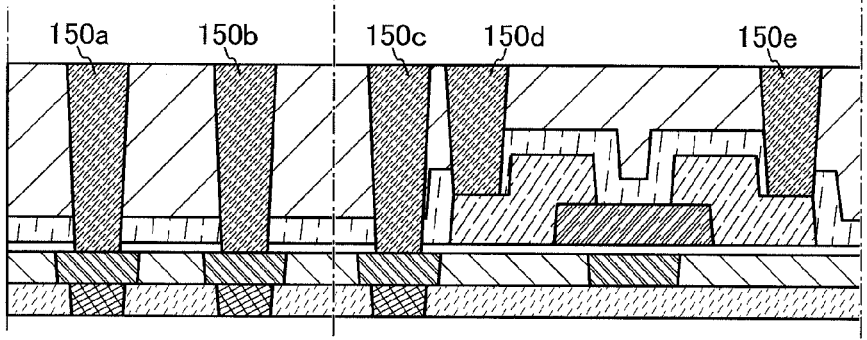
Figure 15D:
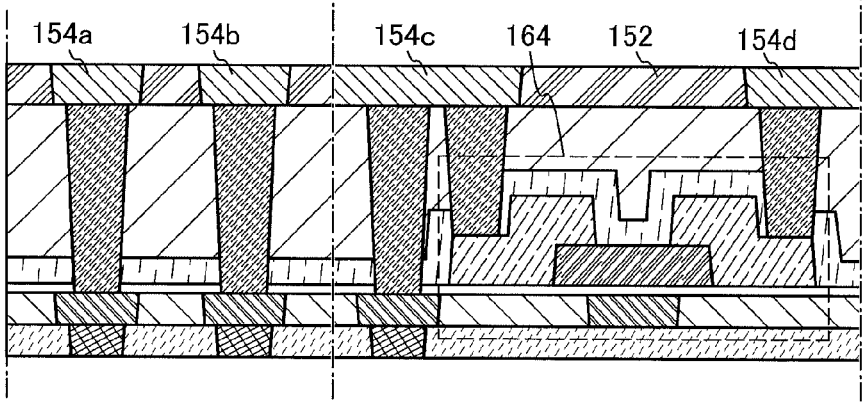

After the conductive layer 148 is formed, part of the conductive layer 148 is removed by a method such as etching or CMP, so that the interlayer insulating layer 146 is exposed and the electrode layer 150a, the electrode layer 150b, the electrode layer 150c, the electrode layer 150d, and the electrode layer 150e are formed (see FIG. 15C). Note that when the electrode layer 150a, the electrode layer 150b, the electrode layer 150c, the electrode layer 150d, and the electrode layer 150e are formed by removing part of the conductive layer 148, it is preferable that a planar surface be formed. By planarizing the surfaces of the interlayer insulating layer 146, the electrode layer 150a, the electrode layer 150b, the electrode layer 150c, the electrode layer 150d, and the electrode layer 150e in such a manner, an electrode, a wiring, an insulating layer, a semiconductor layer, or the like can be favorably formed in a later step.

Further, the insulating layer 152 is formed, and openings reaching the electrode layer 150a, the electrode layer 150b, the electrode layer 150c, the electrode layer 150d, and the electrode layer 150e are formed in the insulating layer 152. Then, a conductive layer is formed so as to be embedded in the openings. After that, part of the conductive layer is removed by etching, CMP, or the like, and the insulating layer 152 is thus exposed, thereby forming the electrode layer 154a, the electrode layer 154b, the electrode layer 154c, and the electrode layer 154d (see FIG. 15D). This step is similar to the step for forming the electrode layer 150a and the like; thus, detailed description is omitted.

<Modification Example of Transistor>

FIG. 16, FIGS. 17A and 17B, FIGS. 18A and 18B, and FIGS. 19A and 19B illustrate modification examples of structures of the transistor 164. That is, the structure of the transistor 160 is the same as the above.

Figure 16:
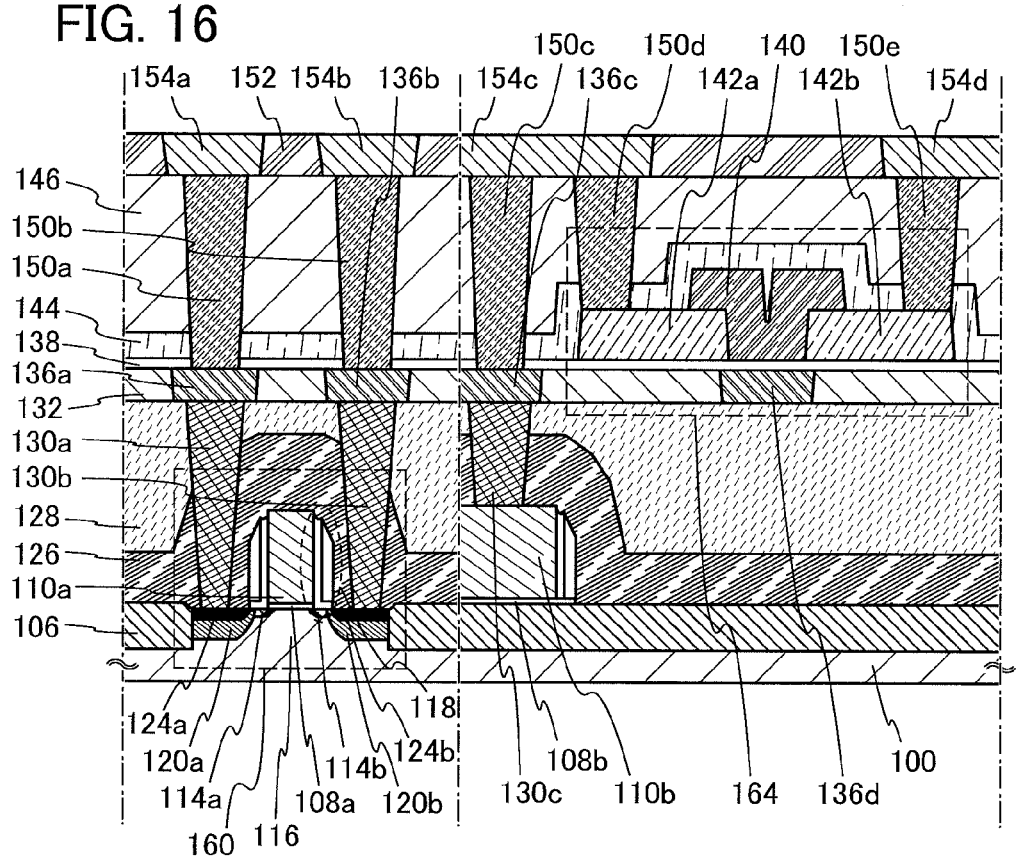
FIG. 16 illustrates a modification example of a transistor.

FIG. 16 illustrates an example of the transistor 164 having a structure in which the gate layer 136d is placed below the oxide semiconductor layer 140 and the source layer 142a and the drain layer 142b are in contact with a bottom surface of the oxide semiconductor layer 140.

A big difference between the structure in FIG. 16 and the structure in FIG. 12 is the position at which the oxide semiconductor layer 140 is connected to the source layer 142a and the drain layer 142b. That is, an upper surface of the oxide semiconductor layer 140 is in contact with the source layer 142a and the drain layer 142b in the structure in FIG. 12, whereas the bottom surface of the oxide semiconductor layer 140 is in contact with the source layer 142a and the drain layer 142b in the structure in FIG. 16. Moreover, the difference in the contact position results in a different arrangement of other electrode layers, an insulating layer, and the like. Note that the details of each component are the same as those of FIG. 12.

Specifically, the transistor 164 illustrated in FIG. 16 includes the gate layer 136d provided over the interlayer insulating layer 128, the gate insulating film 138 provided over the gate layer 136d, the source layer 142a and the drain layer 142b which are provided over the gate insulating film 138, and the oxide semiconductor layer 140 which is in contact with the upper surfaces of the source layer 142a and the drain layer 142b. In addition, over the transistor 164, the protective insulating layer 144 is provided so as to cover the oxide semiconductor layer 140.

Figure 17A:
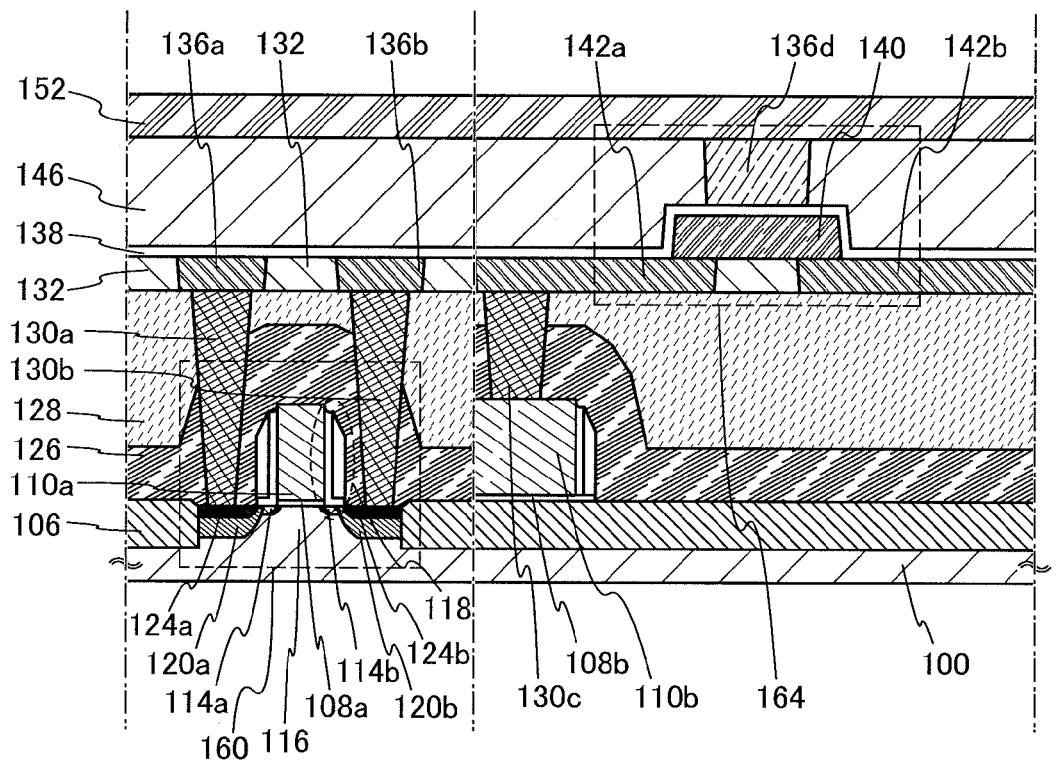
FIGS. 17A and 17B each illustrate a modification example of a transistor.
Figure 17B:
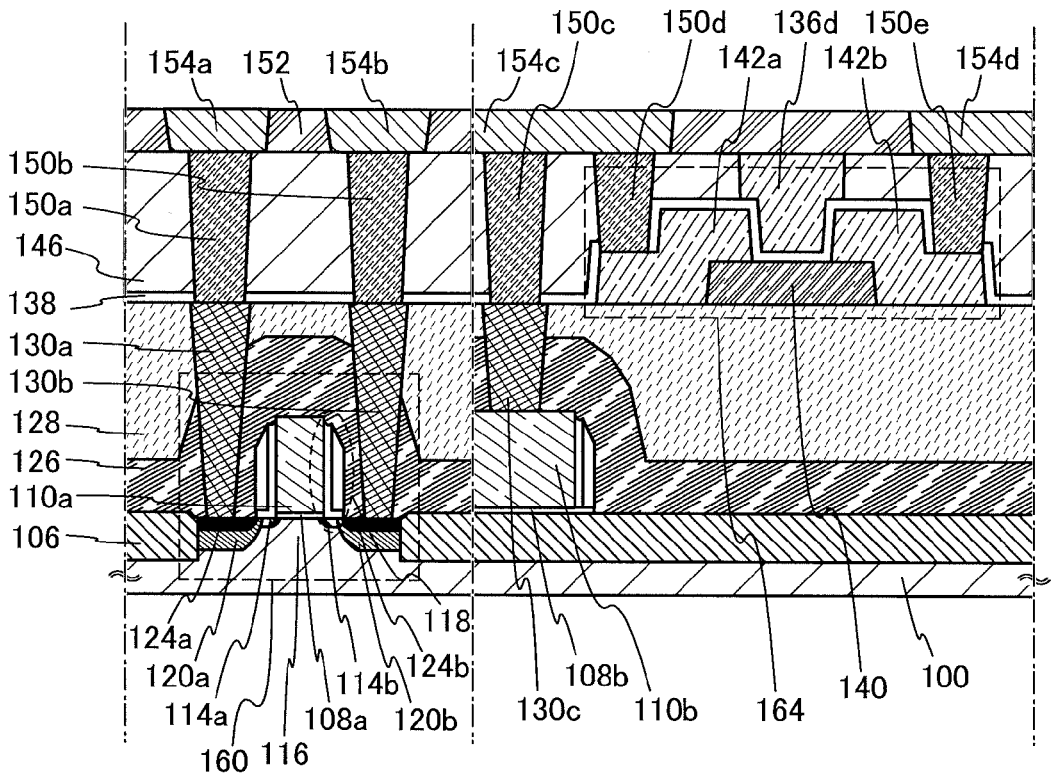

FIGS. 17A and 17B each illustrate the transistor 164 in which the gate layer 136d is provided over the oxide semiconductor layer 140. FIG. 17A illustrates an example of a structure in which the source layer 142a and the drain layer 142b are in contact with a bottom surface of the oxide semiconductor layer 140. FIG. 17B illustrates an example of a structure in which the source layer 142a and the drain layer 142b are in contact with an upper surface of the oxide semiconductor layer 140.

A big difference of the structures in FIGS. 17A and 17B from those in FIG. 12 and FIG. 16 is that the gate layer 136d is placed over the oxide semiconductor layer 140. Furthermore, a big difference between the structure in FIG. 17A and the structure in FIG. 17B is whether the source layer 142a and the drain layer 142b are in contact with the bottom surface or the upper surface of the oxide semiconductor layer 140. Moreover, these differences result in a different arrangement of other electrode layers, an insulating layer, and the like. Note that the details of each component are the same as those of FIG. 12, and the like.

Specifically, the transistor 164 illustrated in FIG. 17A includes the source layer 142a and the drain layer 142b which are provided over the interlayer insulating layer 128, the oxide semiconductor layer 140 in contact with the upper surfaces of the source layer 142a and the drain layer 142b, the gate insulating film 138 provided over the oxide semiconductor layer 140, and the gate layer 136d over the gate insulating film 138 in a region overlapping with the oxide semiconductor layer 140.

The transistor 164 illustrated in FIG. 17B includes the oxide semiconductor layer 140 provided over the interlayer insulating layer 128; the source layer 142a and the drain layer 142b which are provided to be in contact with the upper surface of the oxide semiconductor layer 140; the gate insulating film 138 provided over the oxide semiconductor layer 140, the source layer 142a, and the drain layer 142b; and the gate layer 136d provided over the gate insulating film 138 and in a region overlapping with the oxide semiconductor layer 140.

Note that in the structures in FIGS. 17A and 17B, a component (e.g., the electrode layer 150a or the electrode layer 154a) is sometimes omitted from the structure in FIG. 12 and the like. In this case, simplification of fabricating steps can be achieved secondarily. It is needless to say that a nonessential component can be omitted in the structure in FIG. 12 and the like.

Figure 18A:
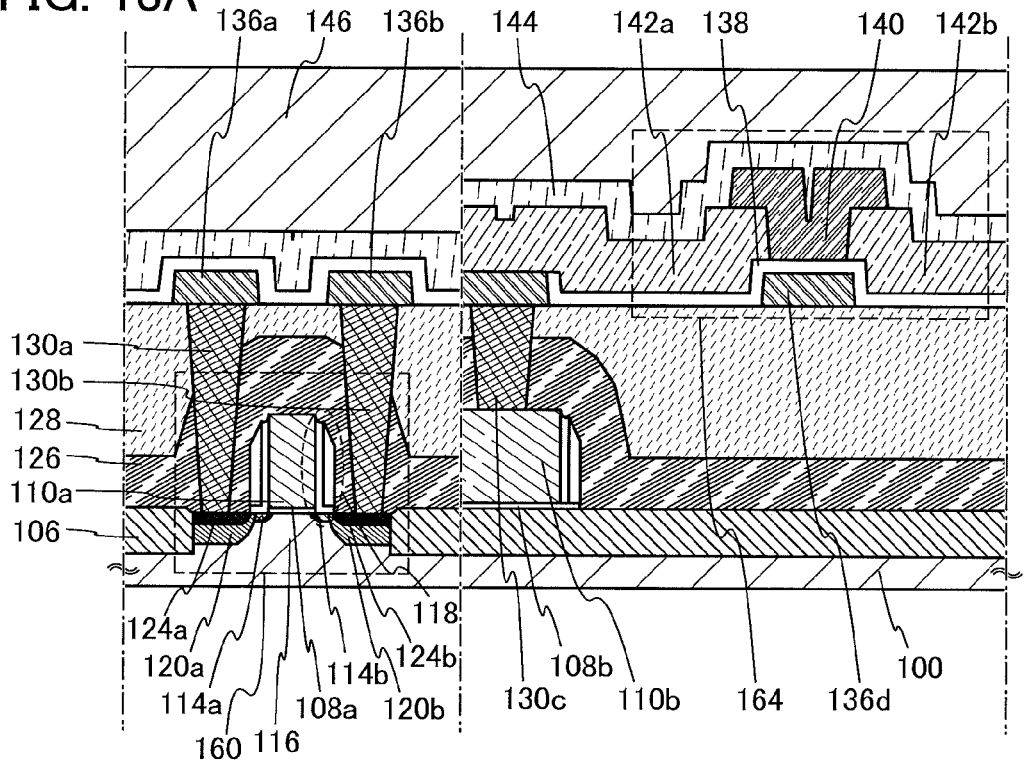
FIGS. 18A and 18B each illustrate a modification example of a transistor.
Figure 18B:
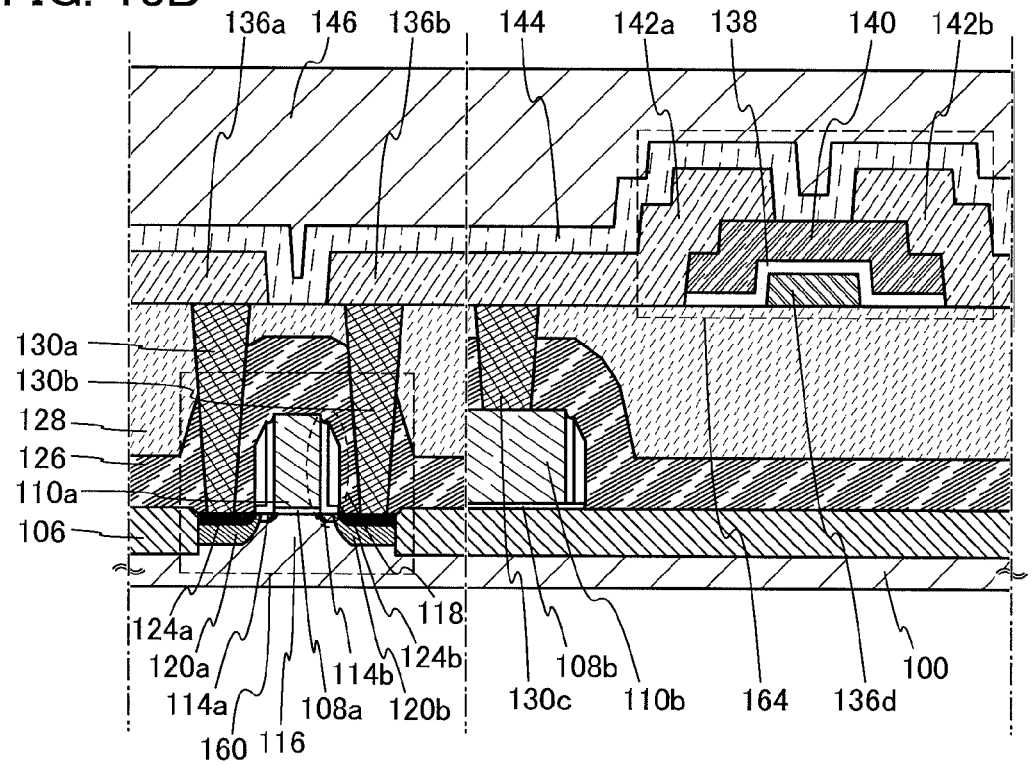

FIGS. 18A and 18B each illustrate the transistor 164 in the case where the size of the element is relatively large and the gate layer 136d is placed under the oxide semiconductor layer 140. In this case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 18A and the structure in FIG. 18B is whether the source layer 142a and the drain layer 142b are in contact with the bottom surface or the upper surface of the oxide semiconductor layer 140. Moreover, these differences result in a different arrangement of other electrode layers, an insulating layer, and the like. The details of each component are the same as those of FIG. 12, and the like.

Specifically, the transistor 164 illustrated in FIG. 18A includes the gate layer 136d provided over the interlayer insulating layer 128, the gate insulating film 138 provided over the gate layer 136d, the source layer 142a and the drain layer 142b which are provided over the gate insulating film 138, and the oxide semiconductor layer 140 which is in contact with the upper surfaces of the source layer 142a and the drain layer 142b.

The transistor 164 illustrated in FIG. 18B includes the gate layer 136d provided over the interlayer insulating layer 128, the gate insulating film 138 provided over the gate layer 136d, the oxide semiconductor layer 140 which is provided over the gate insulating film 138 so as to overlap with the gate layer 136d, and the source layer 142a and the drain layer 142b which are provided in contact with the upper surface of the oxide semiconductor layer 140.

Note that also in the structures in FIGS. 18A and 18B, a component is sometimes omitted from the structure in FIG. 12 and the like. Also in this case, simplification of fabricating steps can be achieved.

Figure 19A:
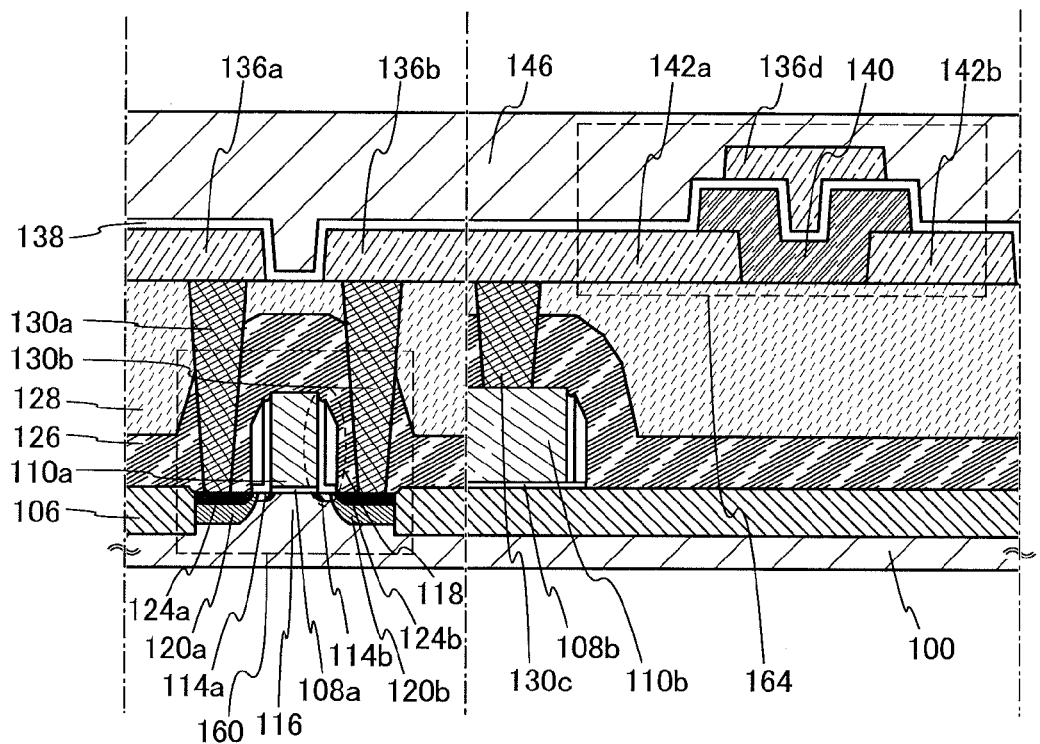
FIGS. 19A and 19B each illustrate a modification example of a transistor.
Figure 19B:
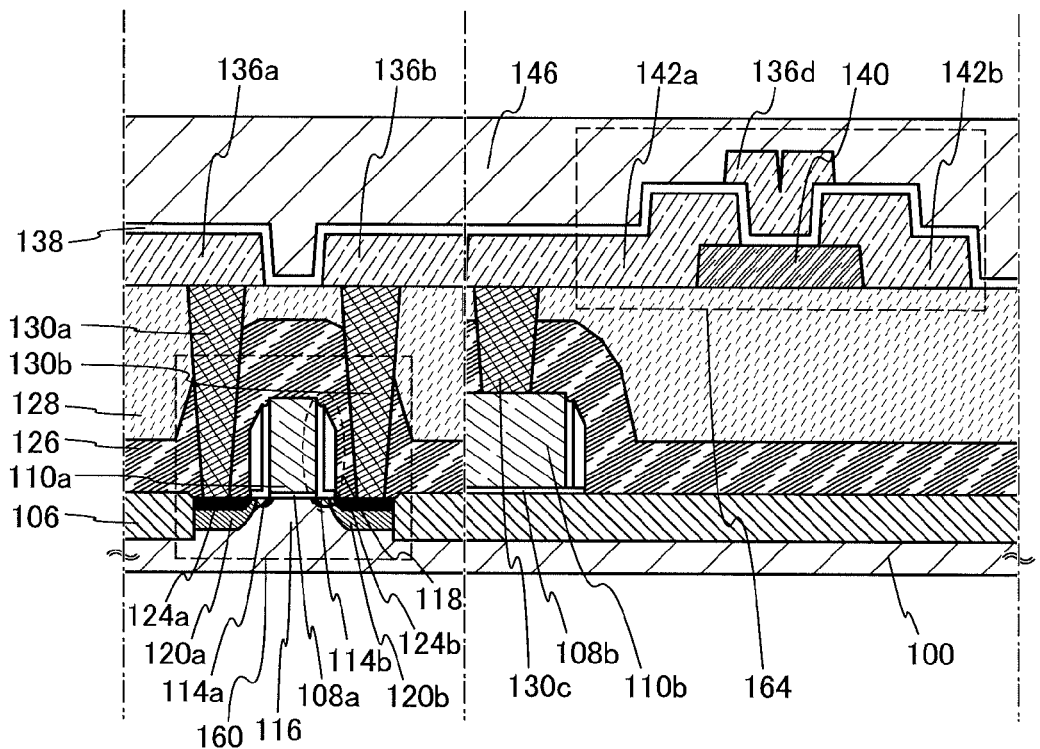

FIGS. 19A and 19B each illustrate the transistor 164 in the case where the size of the element is relatively large and the gate layer 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 19A and the structure in FIG. 19B is whether the source layer 142a and the drain layer 142b are in contact with the bottom surface or the upper surface of the oxide semiconductor layer 140. Moreover, these differences result in a different arrangement of other electrode layers, an insulating layer, and the like. Note that the details of each component are the same as those of FIG. 12, and the like.

Specifically, the transistor 164 illustrated in FIG. 19A includes the source layer 142a and the drain layer 142b provided over the interlayer insulating layer 128; the oxide semiconductor layer 140 in contact with the upper surfaces of the source layer 142a and the drain layer 142b; the gate insulating film 138 provided over the source layer 142a, the drain layer 142b, and the oxide semiconductor layer 140; and the gate layer 136d provided over the gate insulating film 138 and in a region overlapping with the oxide semiconductor layer 140.

The transistor 164 illustrated in FIG. 19B includes the oxide semiconductor layer 140 provided over the interlayer insulating layer 128; the source layer 142a and the drain layer 142b provided to be in contact with the upper surface of the oxide semiconductor layer 140; the gate insulating film 138 provided over the source layer 142a, the drain layer 142b, and the oxide semiconductor layer 140; and the gate layer 136d provided over the gate insulating film 138. Note that the gate layer 136d is provided in a region overlapping with the oxide semiconductor layer 140 with the gate insulating film 138 interposed therebetween.

Note that also in the structures in FIGS. 19A and 19B, a component is sometimes omitted from the structure in FIG. 12 and the like. Also in this case, simplification of fabricating steps can be achieved.

Figure 20:
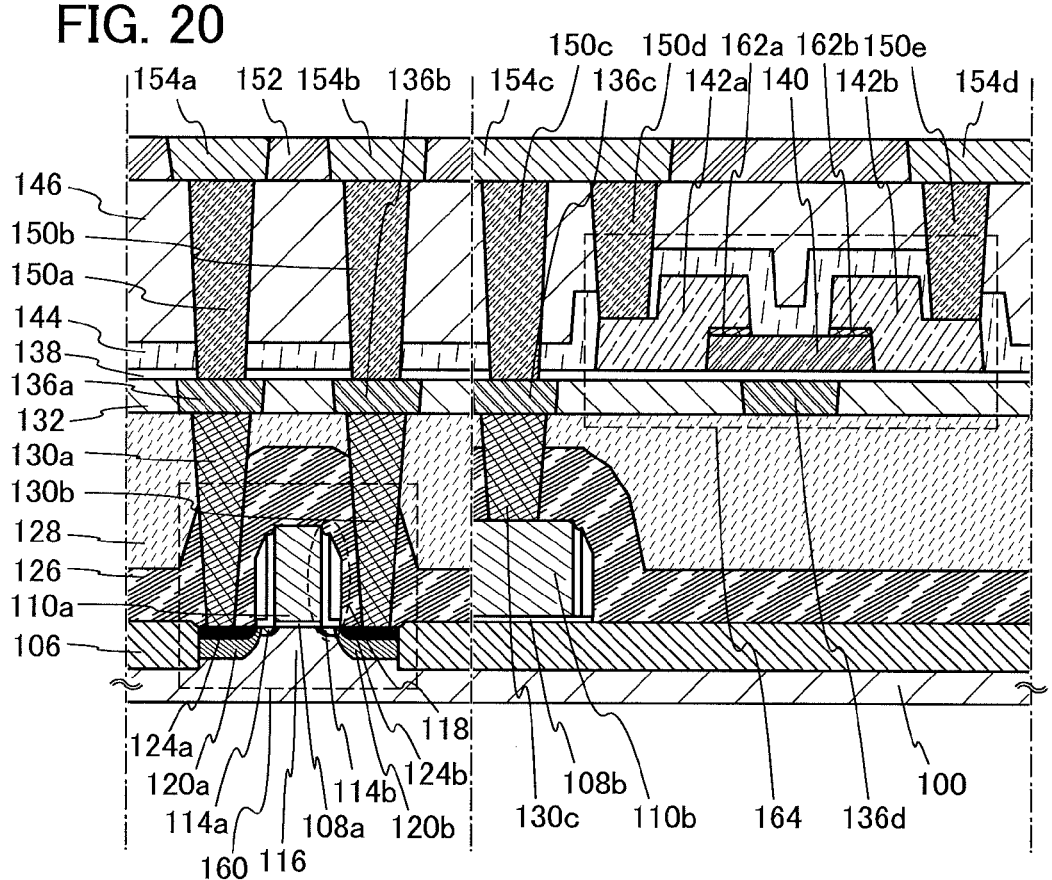
FIG. 20 illustrates a modification example of a transistor.
Figure 21:
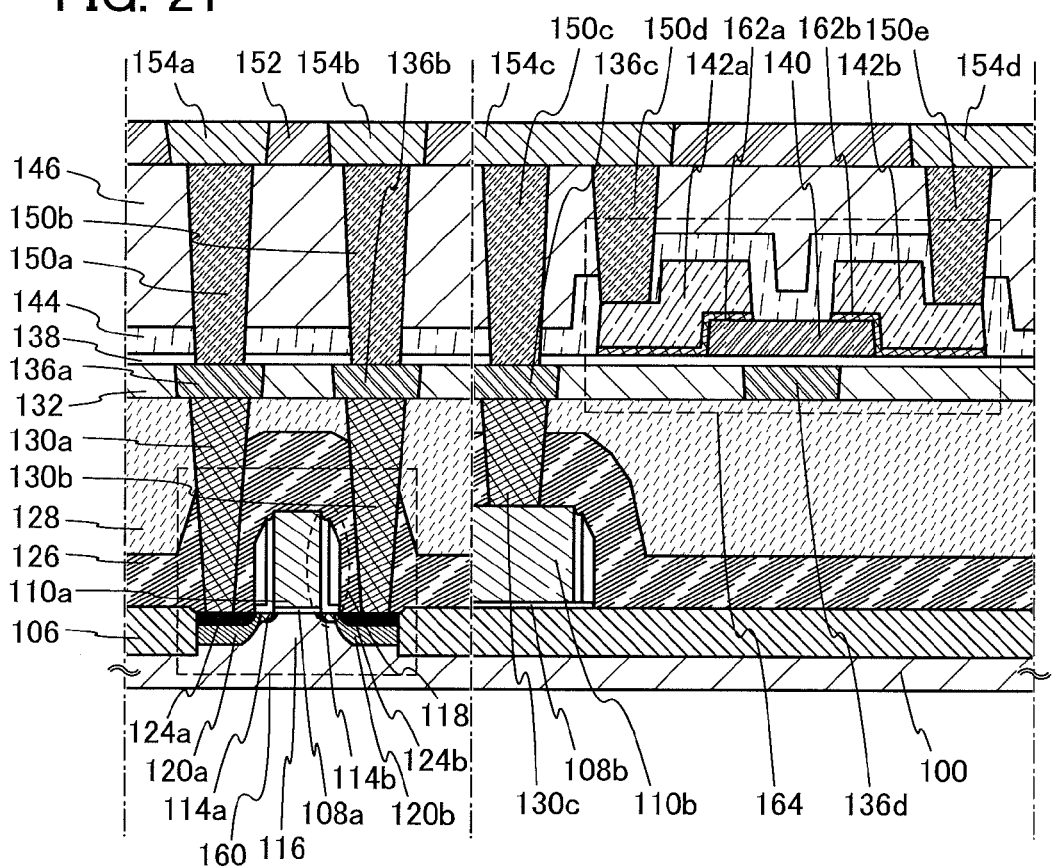
FIG. 21 illustrates a modification example of a transistor.

Oxide conductive layers functioning as a source region and a drain region may be provided as buffer layers between the oxide semiconductor layer 140 and the source and drain layers 142a and 142b illustrated in FIG. 12. FIG. 20 and FIG. 21 each illustrate a transistor obtained by providing the oxide conductive layers in the transistor 164 in FIG. 12.

In the transistors 164 illustrated in FIG. 20 and FIG. 21, oxide conductive layers 162a and 162b functioning as a source region and a drain region are formed between the oxide semiconductor layer 140 and the source and drain layers 142a and 142b. A difference between the transistor 164 in FIG. 20 and that in FIG. 21 is that the shape of the oxide conductive layers 162a and 162b is different depending on the formation step.

In the transistor 164 in FIG. 20, a stack of an oxide semiconductor layer and an oxide conductive layer is formed and processed by one photolithography process, so that the island-shaped oxide semiconductor layer 140 and the island-shaped oxide conductive layer are formed. Then, the source layer 142a and the drain layer 142b are formed over the oxide semiconductor layer and the oxide conductive layer. After that, the island-shaped oxide conductive layer is etched using the source layer 142a and the drain layer 142b as masks, so that the oxide conductive layers 162a and 162b serving as a source region and a drain region are formed.

In the transistor 164 in FIG. 21, an oxide conductive layer is formed over the oxide semiconductor layer 140, and a metal conductive layer is formed thereover. Then, the oxide conductive layer and the metal conductive layer are processed by one photolithography process, so that the oxide conductive layers 162a and 162b serving as a source region and a drain region, the source layer 142a, and the drain layer 142b are formed.

For etching treatment for processing the shape of the oxide conductive layer, the etching conditions (e.g., the kind and concentration of etching gas or etchant, and etching time) are adjusted as appropriate to prevent excessive etching of the oxide semiconductor layer.

As the method for forming the oxide conductive layers 162a and 162b, sputtering, vacuum evaporation (e.g., electron beam evaporation), arc discharge ion plating, or spray coating is used. As a material for the oxide conductive layers, zinc oxide, zinc aluminum oxide, zinc aluminum oxynitride, zinc gallium oxide, indium tin oxide, or the like can be used. In addition, the above materials may contain silicon oxide.

By providing the oxide conductive layers as the source region and the drain region between the oxide semiconductor layer 140 and the source and drain layers 142a and 142b, the resistance of the source region and the drain region can be reduced and the transistor 164 can be operated at high speed.

Further, such a structure can improve the withstand voltage of the transistor 164.

Note that FIG. 20 and FIG. 21 illustrate the structure in which the oxide conductive layers are provided between the oxide semiconductor layer 140 and the source and drain layers 142a and 142b in the transistor 164 illustrated in FIG. 12. Alternatively, the oxide conductive layers can be provided between the oxide semiconductor layer 140 and the source and drain layers 142a and 142b in the transistors 164 illustrated in FIG. 16, FIGS. 17A and 17B, FIGS. 18A and 18B, and FIGS. 19A and 19B.

Note that the example in which the transistor 164 is stacked over the transistor 160 is described here; however, the arrangement of the transistors 160 and 164 is not limited to this example. For example, the transistor 160 and the transistor 164 can be formed over one surface. Further, the transistor 160 and the transistor 164 may be provided to overlap with each other.

<Modification Example of Step for Forming Oxide Semiconductor Layer>

Figure 22A:
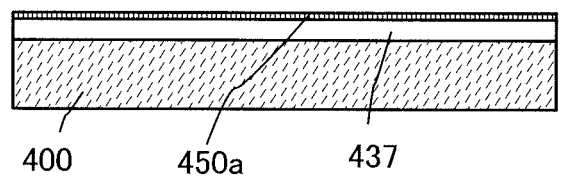
FIGS. 22A to 22C illustrate a modification example of steps of fabricating an oxide semiconductor layer.
Figure 22B:
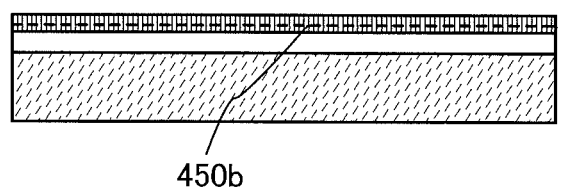

A step for forming an oxide semiconductor layer, which is different from that in the process for forming the above-described transistor, will be described with reference to FIGS. 22A to 22C.

The oxide semiconductor layer includes a first crystalline oxide semiconductor layer and a second crystalline oxide semiconductor layer which is stacked over the first crystalline oxide semiconductor layer and is thicker than the first crystalline oxide semiconductor layer.

An insulating layer 437 is formed over an insulating layer 400. Here, an oxide insulating layer with a thickness of greater than or equal to 50 nm and less than or equal to 600 nm is formed as the insulating layer 437 by a PECVD method or a sputtering method. For example, as the oxide insulating layer, a single layer selected from a silicon oxide layer, a gallium oxide layer, an aluminum oxide layer, a silicon oxynitride layer, an aluminum oxynitride layer, and a silicon nitride oxide layer or a stack of any of these layers can be used.

Next, a first oxide semiconductor layer with a thickness of greater than or equal to 1 nm and less than or equal to 10 nm is formed over the insulating layer 437. The first oxide semiconductor layer is formed by a sputtering method, and the substrate temperature in the film formation by a sputtering method is set to be higher than or equal to 200° C. and lower than or equal to 400° C.

Here, the first oxide semiconductor layer is formed to a thickness of 5 nm in an oxygen atmosphere, an argon atmosphere, or an atmosphere containing argon and oxygen under conditions where a metal oxide target (an In—Ga—Zn-based metal oxide target containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. With the first heat treatment, a first crystalline oxide semiconductor layer 450a is formed (see FIG. 22A).

Depending on the substrate temperature at the time of deposition or the temperature of the first heat treatment, the deposition or the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Thus, it is preferable that oxygen be contained in (in a bulk of) the insulating layer 437 used as a base insulating layer or at the interface between the first crystalline oxide semiconductor layer 450a and the insulating layer 437 at an amount that exceeds at least the amount of oxygen in the stoichiometric composition ratio.

Next, a second oxide semiconductor layer with a thickness of more than 10 nm is formed over the first crystalline oxide semiconductor layer 450a. The second oxide semiconductor layer is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

Here, the second oxide semiconductor layer is formed to a thickness of 25 nm in an oxygen atmosphere, an argon atmosphere, or an atmosphere containing argon and oxygen under conditions where a metal oxide target (an In—Ga—Zn-based metal oxide target containing $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. With the second heat treatment, a second crystalline oxide semiconductor layer 450*b* is formed (see FIG. 22B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450*a* as a nucleus, that is, crystal growth proceeds from the bottom to the inside; thus, the second crystalline oxide semiconductor layer 450*b* is formed.

It is preferable that steps from the formation of the insulating layer 437 to the second heat treatment be successively performed without exposure to the air. The steps from the formation of the insulating layer 437 to the second heat treatment are preferably performed in an atmosphere which includes little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 22C:
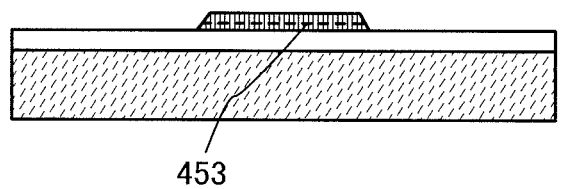

Next, the stack of the oxide semiconductor layers, the first crystalline oxide semiconductor layer 450*a* and the second crystalline oxide semiconductor layer 450*b*, is processed into an oxide semiconductor layer 453 including a stack of island-shaped oxide semiconductor layers (see FIG. 22C). In the drawing, the interface between the first crystalline oxide semiconductor layer 450*a* and the second crystalline oxide semiconductor layer 450*b* is indicated by a dotted line, and the first crystalline oxide semiconductor layer 450*a* and the second crystalline oxide semiconductor layer 450*b* are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as a C-Axis Aligned Crystal (CAAC)), which has neither a single crystal structure nor an amorphous structure. The first crystalline oxide semiconductor layer and the second crystalline oxide semiconductor layer partly include a crystal grain boundary.

Note that examples of a material for the first crystalline oxide semiconductor layer and the second crystalline oxide semiconductor layer include a four-component metal oxide such as an In—Sn—Ga—Zn—O-based material; three-component metal oxides such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, and an In—Lu—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and single-component metal oxides such as an In—O-based material, a Sn—O-based material, and a Zn—O-based material. In addition, the above materials may include $SiO_2$. Here, for example, an In—Ga—Zn—O-based material means an oxide containing indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

By forming a transistor with the use of a stack of a first crystalline oxide semiconductor layer and a second crystalline oxide semiconductor layer, like the oxide semiconductor layer 453, the transistor can have stable electric characteristics and high reliability.

<Application Example of Semiconductor Device>

Figure 23:
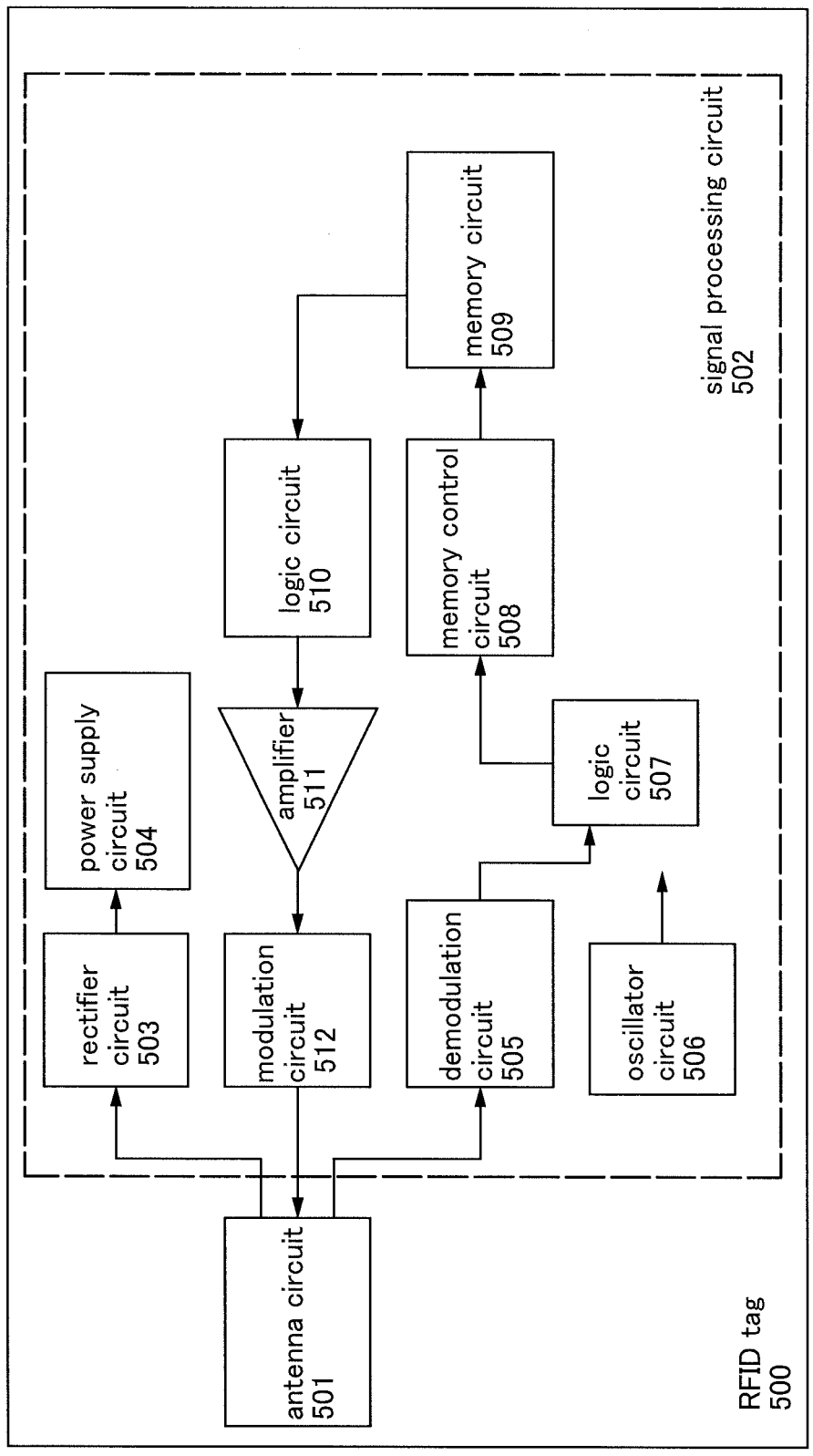
FIG. 23 illustrates a usage example of a semiconductor device.

A radio frequency identification (RFID) tag 500 will be described below as an application example of the above semiconductor device (see FIG. 23).

The RFID tag 500 includes an antenna circuit 501 and a signal processing circuit 502. The signal processing circuit 502 includes a rectifier circuit 503, a power supply circuit 504, a demodulation circuit 505, an oscillator circuit 506, a logic circuit 507, a memory control circuit 508, a memory circuit 509, a logic circuit 510, an amplifier 511, and a modulation circuit 512. The memory circuit 509 includes the above-described semiconductor device.

Communication signals received by the antenna circuit 501 are input to the demodulation circuit 505. The frequency of the communication signals received, that is, signals transmitted and received between the antenna circuit 501 and a reader/writer can be, UHF (ultra high frequency) bands including 915 MHz, 2.45 GHz, and the like that are determined on the basis of the ISO standards or the like. Needless to say, the frequency of signals transmitted and received between the antenna circuit 501 and the reader/writer is not limited to this, and for example, any of the following frequencies can be used: 300 GHz to 3 THz which is a submillimeter wave, 30 GHz to 300 GHz which is a millimeter wave, 3 GHz to 30 GHz which is a microwave, 300 MHz to 3 GHz which is an ultra high frequency, and 30 MHz to 300 MHz which is a very high frequency. In addition, signals transmitted and received between the antenna circuit 501 and the reader/writer are signals obtained through carrier modulation. A carrier wave is modulated by analog modulation or digital modulation, and any of amplitude modulation, phase modulation, frequency modulation, and spread spectrum may be used. Preferably, amplitude modulation or frequency modulation is used.

An oscillation signal output from the oscillator circuit 506 is supplied as a clock signal to the logic circuit 507. In addition, the modulated carrier wave is demodulated in the demodulation circuit 505. The demodulated signal is transmitted to the logic circuit 507 and analyzed. The signal analyzed in the logic circuit 507 is transmitted to the memory control circuit 508. The memory control circuit 508 controls the memory circuit 509, takes out data stored in the memory circuit 509, and transmits the data to the logic circuit 510. The data is encoded in the logic circuit 510. Then, the data which is encoded is amplified in the amplifier 511. Based on the amplified data, the modulation circuit 512 modulates carrier waves. In accordance with the modulated carrier wave, the reader/writer recognizes the signal from the RFID tag 500.

Carrier waves input to the rectifier circuit 503 are rectified and then input to the power supply circuit 504. Power supply voltage obtained in this manner is supplied by the power supply circuit 504 to the demodulation circuit 505, the oscillator circuit 506, the logic circuit 507, the memory control circuit 508, the memory circuit 509, the logic circuit 510, the amplifier 511, the modulation circuit 512, and the like.

A connection between the signal processing circuit 502 and an antenna in the antenna circuit 501 is not particularly limited. For example, the antenna and the signal processing circuit 502 are connected by wire bonding or bump connection. Alternatively, the signal processing circuit 502 is formed to have a chip shape and one surface thereof is used as an electrode and attached to the antenna. The signal processing circuit 502 and the antenna can be attached to each other by the use of an anisotropic conductive film (ACF).

The antenna is either formed over the same substrate as the signal processing circuit 502, or formed as an external antenna. Needless to say, the antenna is provided on an upper portion or a lower portion of the signal processing circuit.

The rectifier circuit 503 converts AC signals that are induced by carrier waves received by the antenna circuit 501 into DC signals.

Figure 24:
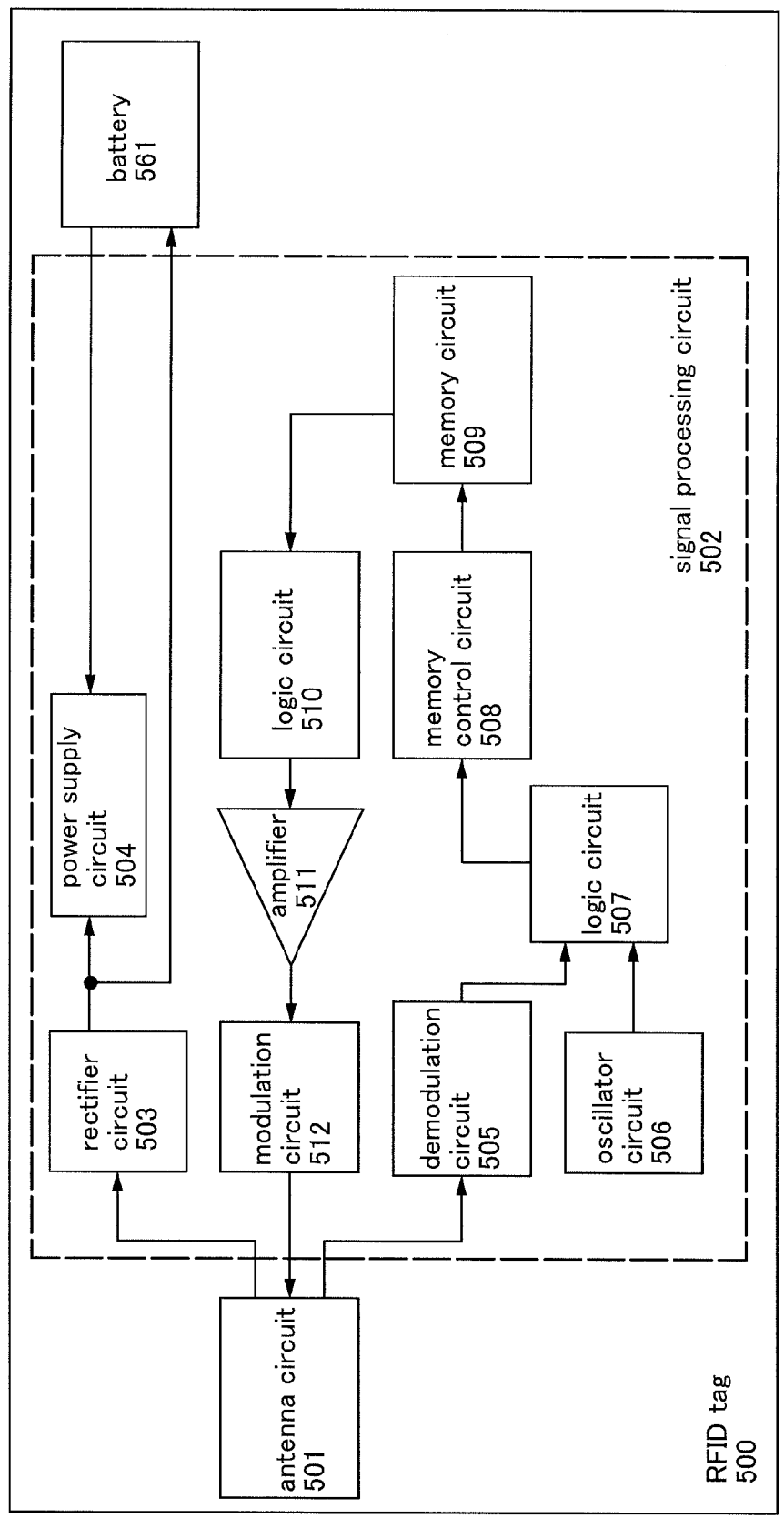
FIG. 24 illustrates a usage example of a semiconductor device.
Figure 25A:
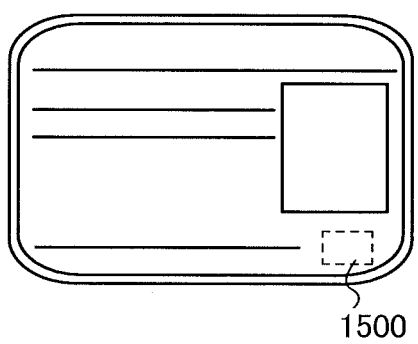
FIGS. 25A to 25F each illustrate a usage example of a semiconductor device.
Figure 25B:
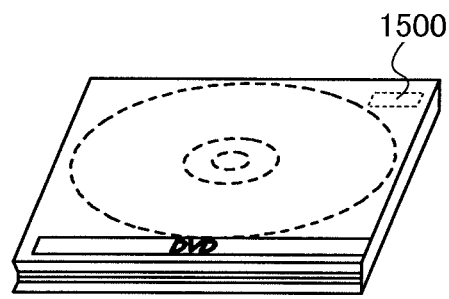
Figure 25C:
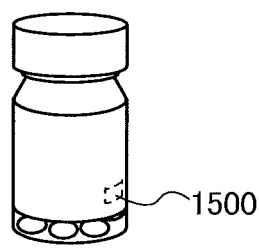
Figure 25D:
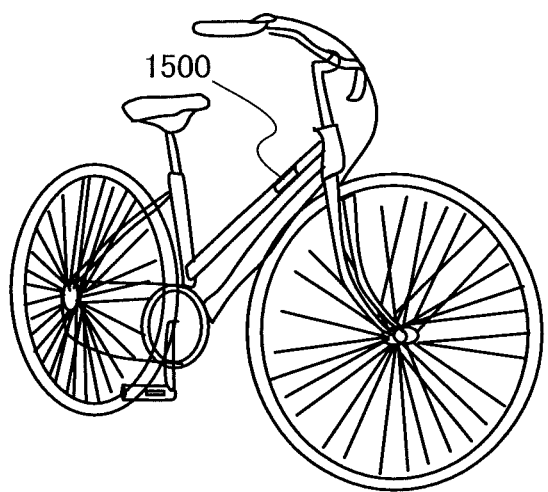
Figure 25E:
Figure 25F:
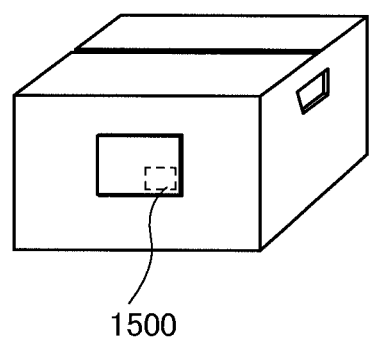

The RFID tag 500 may include a battery 561 (see FIG. 24). When power supply voltage output from the rectifier circuit 503 is not high enough to operate the signal processing circuit 502, the battery 561 also supplies power supply voltage to each of the circuits included in the signal processing circuit 502 (the circuits such as the demodulation circuit 505, the oscillator circuit 506, the logic circuit 507, the memory control circuit 508, the memory circuit 509, the logic circuit 510, the amplifier 511, and the modulation circuit 512).

Surplus voltage of the power supply voltage output from the rectifier circuit 503 may be stored in the battery 561. When an antenna circuit and a rectifier circuit are provided in the RFID tag 500 in addition to the antenna circuit 501 and the rectifier circuit 503, energy stored in the battery 561 can be obtained from electromagnetic waves and the like that are generated randomly.

A battery can be continuously used by charging. As the battery, a battery formed into a sheet form is used. For example, by using a lithium polymer battery that includes a gel electrolyte, a lithium ion battery, a lithium secondary battery, or the like, a reduction in the size of the battery can be realized. For example, a nickel metal hydride battery, a nickel cadmium battery, a capacitor having large capacitance, and the like can be given.

Note that, as illustrated in FIGS. 25A to 25F, the RFID is widely used by being provided in, for example, products such as bills, coins, securities, bearer bonds, documents (such as driver's licenses or resident's cards, see FIG. 25A), storage media (such as DVD software or video tapes, see FIG. 25B), packaging containers (such as wrapping paper or bottles, see FIG. 25C), vehicles (such as bicycles, see FIG. 25D), personal belongings (such as bags or glasses), foods, plants, animals, human bodies, clothes, household goods or electronic appliances (liquid crystal display devices, EL display devices, television receivers, or mobile phones), tags on products (see FIGS. 25E and 25F), or the like.

An RFID tag 1500 is fixed to a product by being mounted on a printed board, being attached to a surface of the product, or being embedded in the product. For example, the RFID tag 1500 is incorporated in paper of a book or an organic resin package to be fixed to each object. Since the RFID tag 1500 can be reduced in size, thickness, and weight, it can be fixed to a product without spoiling the design of the product. Further, by providing the RFID tag 1500 for bills, coins, securities, bearer bonds, documents, and the like, an identification function can be obtained and forgery thereof can be prevented by utilizing the identification function. Further, when the RFID tag 1500 is attached to packaging containers, storage media, personal belongings, foods, clothes, household goods, electronic appliances, or the like, a system such as an inspection system can be efficiently used. In addition, even for a vehicle, the level of security against theft or the like can be raised when the RFID tag 1500 is attached to the vehicle.

When the above semiconductor device is used for such purposes, data which is used for exchanging information can be maintained at an accurate value. Thus, authenticity or security of an object can be improved.

This application is based on Japanese Patent Application serial No. 2010-189665 filed with Japan Patent Office on Aug. 26, 2010, the entire contents of which are hereby incorporated by reference.

What is claimed is:
1. A semiconductor device comprising:
  a memory cell array including a plurality of memory cells arranged in matrix,
  wherein one of the memory cells includes a node and a transistor,
  wherein the transistor comprises a source, a drain and an oxide semiconductor layer,
  wherein one of the source and the drain of the transistor is electrically connected to the node, and the other of the source and the drain of the transistor is electrically connected to a wiring,
  wherein the oxide semiconductor layer includes a channel region, and
  wherein the memory cell is configured to store data in the node in accordance with a signal applied to the wiring.
2. The semiconductor device according to claim 1, wherein the data stored in the one of the memory cells is multilevel data.

3. The semiconductor device according to claim 1, wherein the semiconductor device is mounted in an RFID.

4. The semiconductor device according to claim 3, wherein the RFID is provided in an object selected from the group consisting of a liquid crystal display device, an EL display device, a television receiver, a mobile phone, and a tag on a product.

5. A semiconductor device comprising:
a memory cell array including a plurality of memory cells arranged in matrix,
wherein one of the memory cells includes a node, a first transistor, a second transistor and a capacitor,
wherein the first transistor comprises a source, a drain and an oxide semiconductor layer,
wherein one of the source and the drain of the first transistor is electrically connected to the node, and the other of the source and the drain of the first transistor is electrically connected to a first wiring,
wherein the node is electrically connected to a gate of the second transistor and a first electrode of the capacitor,
wherein a second electrode of the capacitor is electrically connected to a second wiring,
wherein the oxide semiconductor layer includes a channel region, and
wherein the memory cell is configured to store data in the node in accordance with a first signal applied to the first wiring and a second signal applied to the second wiring.

6. The semiconductor device according to claim 5, wherein the data stored in the one of the memory cells is multilevel data.

7. The semiconductor device according to claim 5, wherein the semiconductor device is mounted in an RFID.

8. The semiconductor device according to claim 7, wherein the RFID is provided in an object selected from the group consisting of a liquid crystal display device, an EL display device, a television receiver, a mobile phone, and a tag on a product.

9. The semiconductor device according to claim 5, wherein the second transistor includes a semiconductor material other than an oxide semiconductor.

10. A semiconductor device comprising:
a memory cell array including a plurality of memory cells arranged in matrix;
a row decoder configured to select a given row of the memory cell array in accordance with a row address signal;
a column decoder configured to select a given column of the memory cell array in accordance with a column address signal;
a row address latch configured to hold the row address signal and to output the row address signal to the row decoder; and
a column address latch configured to hold the column address signal and to output the column address signal to the column decoder,
wherein one of the memory cells includes a node and a transistor,
wherein the transistor comprises a source, a drain and an oxide semiconductor layer,
wherein one of the source and the drain of the transistor is electrically connected to the node, and the other of the source and the drain of the transistor is electrically connected to a first wiring,
wherein the oxide semiconductor layer includes a channel region,
wherein the memory cell is configured to store data in the node in accordance with a signal applied to the first wiring, and
wherein supply of the row address signal to the row address latch and supply of the column address signal to the column address latch are performed through a second wiring.

11. The semiconductor device according to claim 10, wherein the data stored in the one of the memory cells is multilevel data.

12. The semiconductor device according to claim 10, wherein at least one of the row address latch and the column address latch is formed using a transistor whose channel region is formed from an oxide semiconductor.

13. The semiconductor device according to claim 10, wherein the semiconductor device is mounted in an RFID.

14. The semiconductor device according to claim 13, wherein the REID is provided in an object selected from the group consisting of a liquid crystal display device, an EL display device, a television receiver, a mobile phone, and a tag on a product.

15. A semiconductor device comprising:
a memory cell array including a plurality of memory cells arranged in matrix;
a row decoder configured to select a given row of the memory cell array in accordance with a row address signal;
a column decoder configured to select a given column of the memory cell array in accordance with a column address signal;
a row address latch configured to hold the row address signal and to output the row address signal to the row decoder;
a column address latch configured to hold the column address signal and to output the column address signal to the column decoder,
wherein one of the memory cells includes a node, a first transistor, a second transistor and a capacitor,
wherein the first transistor comprises a source, a drain and an oxide semiconductor layer,
wherein one of the source and the drain of the first transistor is electrically connected to the node, the other of the source and the drain of the first transistor is electrically connected to a first wiring,
wherein the node is electrically connected to a gate of the second transistor and a first electrode of the capacitor,
wherein a second electrode of the capacitor is electrically connected to a second wiring,
wherein the oxide semiconductor layer includes a channel region,
wherein the memory cell is configured to store data in the node in accordance with a first signal applied to the first wiring and a second signal applied to the second wiring, and
wherein supply of the row address signal to the row address latch and supply of the column address signal to the column address latch are performed through a third wiring.

16. The semiconductor device according to claim 15, wherein the data held in the one of the memory cells is multilevel data.

17. The semiconductor device according to claim 15, wherein at least one of the row address latch and the column address latch is formed using a transistor whose channel region is formed from an oxide semiconductor.

18. The semiconductor device according to claim 15, wherein the semiconductor device is mounted in an RFID.

19. The semiconductor device according to claim 18, wherein the RFID is provided in an object selected from the group consisting of a liquid crystal display device, an EL display device, a television receiver, a mobile phone, and a tag on a product.

20. The semiconductor device according to claim 15, wherein the second transistor includes a semiconductor material other than an oxide semiconductor.

* * * * *

UNITED STATES PATENT AND TRADEMARK OFFICE
CERTIFICATE OF CORRECTION

PATENT NO. : 8,582,349 B2
APPLICATION NO. : 13/216562
DATED : November 12, 2013
INVENTOR(S) : Shunpei Yamazaki et al.

It is certified that error appears in the above-identified patent and that said Letters Patent is hereby corrected as shown below:

In the Specifications

Column 6, line 29, after "least" replace "in" with --$m$--;

Column 18, line 39, before "row" replace "in" with --$m$--;

Column 25, line 19, replace "fanned" with --formed--;

Column 31, line 47, replace "found" with --formed--;

Column 31, line 66, replace "farmed" with --formed--;

In the Claims

Column 42, line 18, in claim 14 replace "REID" with --RFID--.

Signed and Sealed this
Fifteenth Day of April, 2014

Michelle K. Lee
*Deputy Director of the United States Patent and Trademark Office*